(12) United States Patent
Nakano et al.

(10) Patent No.: US 11,869,597 B2
(45) Date of Patent: Jan. 9, 2024

(54) SEMICONDUCTOR STORAGE DEVICE INCLUDING A VOLTAGE GENERATOR FOR APPLYING FIRST AND SECOND INTERMEDIATE VOLTAGES TO AN ADJACENT WORD LINE IN A PROGRAM OPERATION

(71) Applicant: Kioxia Corporation, Tokyo (JP)

(72) Inventors: Takeshi Nakano, Kawasaki (JP);
Yuzuru Shibazaki, Fujisawa (JP);
Hideyuki Kataoka, Yokohama (JP);
Junichi Sato, Yokohama (JP); Hiroki Date, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 133 days.

(21) Appl. No.: 17/464,297

(22) Filed: Sep. 1, 2021

(65) Prior Publication Data
US 2022/0301630 A1 Sep. 22, 2022

(30) Foreign Application Priority Data
Mar. 18, 2021 (JP) .................. 2021-045259

(51) Int. Cl.
*G11C 16/10* (2006.01)
*G11C 16/26* (2006.01)
(Continued)

(52) U.S. Cl.
CPC ........ *G11C 16/102* (2013.01); *G11C 16/0433* (2013.01); *G11C 16/08* (2013.01);
(Continued)

(58) Field of Classification Search
CPC ......... G11C 16/06; G11C 16/08; G11C 16/10; G11C 16/107; G11C 16/12; G11C 16/24;
(Continued)

(56) References Cited

U.S. PATENT DOCUMENTS 7,852,682 B2    12/2010    Byeon et al.
7,885,113 B2    2/2011    Ju
(Continued)

FOREIGN PATENT DOCUMENTS

JP    2007-12239 A    1/2007
JP    6652457 B2    2/2020
JP    2020-102287 A    7/2020

*Primary Examiner* — Kretelia Graham
(74) *Attorney, Agent, or Firm* — Oblon, McClelland, Maier & Neustadt, L.L.P.

(57) ABSTRACT

A semiconductor storage device in an embodiment includes a plurality of planes each including a memory cell array, a voltage generation circuit configured to apply a first intermediate voltage to an adjacent word line adjacent to a selected word line in a former half of a program period and apply a second intermediate voltage higher than the first intermediate voltage to the adjacent word line in a latter half of the program period, a discharge circuit configured to feed a discharge current from the selected word line in a period corresponding to a period in which the second intermediate voltage is applied to the adjacent word line, and a control circuit configured to set a discharge characteristic of the discharge circuit according to a number of the planes.

8 Claims, 17 Drawing Sheets

(51) Int. Cl.
*G11C 16/30* (2006.01)
*G11C 29/42* (2006.01)
*G11C 16/08* (2006.01)
*G11C 16/04* (2006.01)
*G11C 16/24* (2006.01)

(52) U.S. Cl.
CPC .............. *G11C 16/24* (2013.01); *G11C 16/26* (2013.01); *G11C 16/30* (2013.01); *G11C 29/42* (2013.01)

(58) Field of Classification Search
CPC ..... G11C 16/32; G11C 16/34; G11C 16/3436; G11C 16/3454; G11C 16/3459
See application file for complete search history.

(56) References Cited

U.S. PATENT DOCUMENTS

| | | |
|---|---|---|
| 8,045,380 B2 | 10/2011 | Byeon et al. |
| 9,859,012 B1 | 1/2018 | Hioka |
| 10,008,270 B2 * | 6/2018 | Lee .................. G11C 16/24 |
| 10,079,066 B2 | 9/2018 | Hioka |
| 10,388,381 B2 * | 8/2019 | Shin .................. G11C 16/30 |
| 10,403,374 B2 | 9/2019 | Hioka |
| 10,424,366 B2 | 9/2019 | Yoo |
| 2007/0002624 A1 | 1/2007 | Ju |
| 2011/0007572 A1 * | 1/2011 | Ueno .................. G11C 11/5628 |
| | | 365/185.22 |
| 2019/0066793 A1 | 2/2019 | Shin et al. |
| 2020/0202964 A1 | 6/2020 | Sako |

* cited by examiner

SEMICONDUCTOR STORAGE DEVICE INCLUDING A VOLTAGE GENERATOR FOR APPLYING FIRST AND SECOND INTERMEDIATE VOLTAGES TO AN ADJACENT WORD LINE IN A PROGRAM OPERATION

CROSS REFERENCE TO RELATED APPLICATION

This application is based upon and claims the benefit of priority from the prior Japanese Patent Application No. 2021-45259 filed in Japan on Mar. 18, 2021; the entire contents of which are incorporated herein by reference.

FIELD

Embodiments described herein relate generally to a semiconductor storage device.

BACKGROUND

In recent years, three-dimensional structures have been developed for semiconductor storage devices such as NAND memories in response to requests for miniaturization and capacity enlargement. A memory cell transistor is not only configured as an SLC (single level cell) capable of storing 1-bit (binary) data but also configured as an MLC (multi-level cell) capable of storing 2-bit (quaternary) data, a TLC (triple level cell) capable of storing 3-bit (octal) data, or a QLC (quad level cell) capable of storing 4-bit (hexadecimal) data.

In such a semiconductor device, a configuration in which a plurality of planes physically independent from one another are disposed in a memory chip is sometimes adopted.

When a writing operation is simultaneously performed for the plurality of planes, a difference sometimes occurs in writing speed depending on the number of simultaneously operating planes.

DETAILED DESCRIPTION

A semiconductor storage device in an embodiment includes: a plurality of planes each including a memory cell array configured by a plurality of memory cells, word lines connected to gates of the plurality of memory cells, and bit lines electrically connected to one ends of the plurality of memory cells via selection gate transistors respectively connected to the one ends of the plurality of memory cells; a voltage generation circuit capable of generating a voltage supplied to one or more of the memory cell arrays respectively included in the plurality of planes, the voltage generation circuit supplying a program voltage to a writing target selected word line in a program period and applying a first intermediate voltage to an adjacent word line adjacent to the selected word line in a former half of the program period and applying a second intermediate voltage higher than the first intermediate voltage to the adjacent word line in a latter half of the program period; a discharge circuit provided on a path between the voltage generation circuit and the selected word line and configured to feed a discharge current from the selected word line in a period corresponding to a period in which the second intermediate voltage is applied to the adjacent word line; and a control circuit configured to set a discharge characteristic of the discharge circuit according to a number of the planes to which the program voltage is simultaneously supplied from the voltage generation circuit.

Embodiments of the present invention are explained in detail below with reference to the drawings.

First Embodiment

The present embodiment reduces a writing time by controlling a program voltage supplied to respective planes according to control of VPASS_SHIFT explained below to thereby achieve uniformization of a supplied program voltage irrespective of the number of simultaneously operating planes.

(Configuration of a Memory System)

Figure 1:
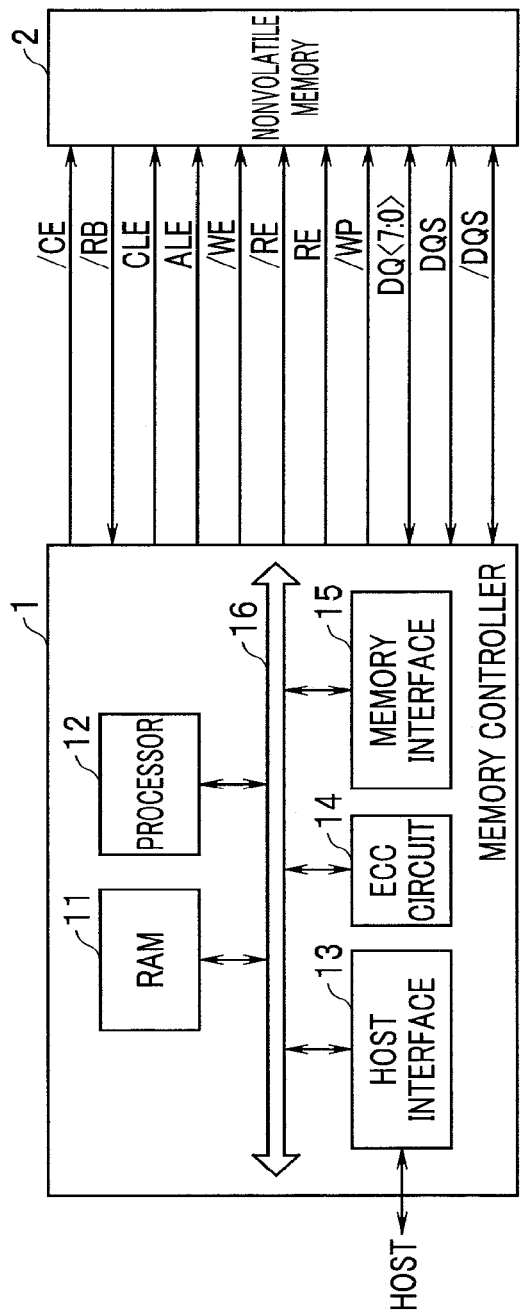
FIG. 1 is a block diagram showing a configuration example of a memory system according to a first embodiment.

FIG. 1 is a block diagram showing a configuration example of a memory system according to the embodiment. The memory system in the present embodiment includes a memory controller 1 and a nonvolatile memory 2. The memory system is connectable to a host. The host is an electronic device such as a personal computer or a portable terminal.

The nonvolatile memory 2 is a semiconductor storage device that stores data in a nonvolatile manner and is configured by, for example, a NAND memory. In the present embodiment, the nonvolatile memory 2 is explained as being a NAND memory including a memory cell transistor capable of storing 4 bits per one memory cell transistor, that is, a NAND memory of a 4-bit/Cell (QLC: quad level cell). However, the nonvolatile memory 2 is not limited to this. The nonvolatile memory 2 is made three-dimensional.

The memory controller 1 controls writing of data in the nonvolatile memory 2 according to a write request from the host. The memory controller 1 controls readout of data from the nonvolatile memory 2 according to a readout request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to one another by an internal bus 16.

The host interface 13 outputs a request received from the host, write data, which is user data, and the like to the internal bus 16. The host interface 13 transmits user data read out from the nonvolatile memory 2, a response from the processor 12, and the like to the host.

The memory interface 15 controls, based on an instruction of the processor 12, processing for writing user data and the like in the nonvolatile memory 2 and processing for reading out user data and the like from the nonvolatile memory 2.

The processor 12 collectively controls the memory controller 1. The processor 12 is, for example, a CPU (central processing unit) or an MPU (micro processing unit). When receiving a request from the host through the host interface 13, the processor 12 performs control conforming to the request. For example, the processor 12 instructs, according to the request from the host, the memory interface 15 to write user data and parity in the nonvolatile memory 2. The processor 12 instructs, according to the request from the host, the memory interface 15 to read out user data and parity from the nonvolatile memory 2.

The processor 12 determines a storage region (hereinafter referred to as memory region) on the nonvolatile memory 2 for user data accumulated in the RAM 11. The user data is stored in the RAM 11 through the internal bus 16. The processor 12 carries out the determination of the memory region for data in a page unit, which is a write unit, that is, page data. In this specification, user data stored in one page of the nonvolatile memory 2 is defined as unit data. The unit data is, for example, encoded and stored in the nonvolatile memory 2 as a codeword.

Note that the encoding is not essential. The memory controller 1 may store the unit data in the nonvolatile memory 2 without encoding the unit data. However, in FIG. 1, a configuration for performing the encoding is shown as a configuration example. When the memory controller 1 does not perform the encoding, the page data coincides with the unit data. One codeword may be generated based on one unit data. One codeword may be generated based on divided data obtained by dividing the unit data. One codeword may be generated using a plurality of unit data.

The processor 12 determines a memory region of the nonvolatile memory 2 at a writing destination for each unit data. Physical addresses are allocated to memory regions of the nonvolatile memory 2. The processor 12 manages a memory region at a writing destination of the unit data using a physical address. The processor 12 designates a physical address of the determined memory region and instructs the memory interface 15 to write user data in the nonvolatile memory 2. The processor 12 manages correspondence between logical addresses (logical addresses managed by the host) and physical addresses of the user data. When receiving a readout request including a logical address from the host, the processor 12 specifies a physical address corresponding to the logical address, designates the physical address, and instructs the memory interface 15 to read out the user data.

The ECC circuit 14 encodes the user data stored in the RAM 11 and generates a codeword. The ECC circuit 14 decodes a codeword read out from the nonvolatile memory 2.

The RAM 11 temporarily stores user data received from the host until the data is stored in the nonvolatile memory 2 or temporarily stores data read out from the nonvolatile memory 2 until the data is transmitted to the host. The RAM 11 is a general-purpose memory such as an SRAM (static random access memory) or a DRAM (dynamic random access memory).

In FIG. 1, a configuration example is shown in which the memory controller 1 includes the ECC circuit 14 and the memory interface 15. However, the ECC circuit 14 may be incorporated in the memory interface 15. The ECC circuit 14 may be incorporated in the nonvolatile memory 2.

When receiving a write request from the host, the memory controller 1 operates as explained below. The processor 12 causes the RAM 11 to temporarily store write data. The processor 12 reads out data stored in the RAM 11 and inputs the data to the ECC circuit 14. The ECC circuit 14 encodes the inputted data and inputs a codeword to the memory interface 15. The memory interface 15 writes the inputted codeword in the nonvolatile memory 2.

When receiving a readout request from the host, the memory controller 1 operates as explained below. The memory interface 15 inputs a codeword read out from the nonvolatile memory 2 to the ECC circuit 14. The ECC circuit 14 decodes the inputted codeword and stores decoded data in the RAM 11. The processor 12 transmits the data stored in the RAM 11 to the host via the host interface 13.

(Schematic Configuration of the Nonvolatile Memory)

Figure 2:
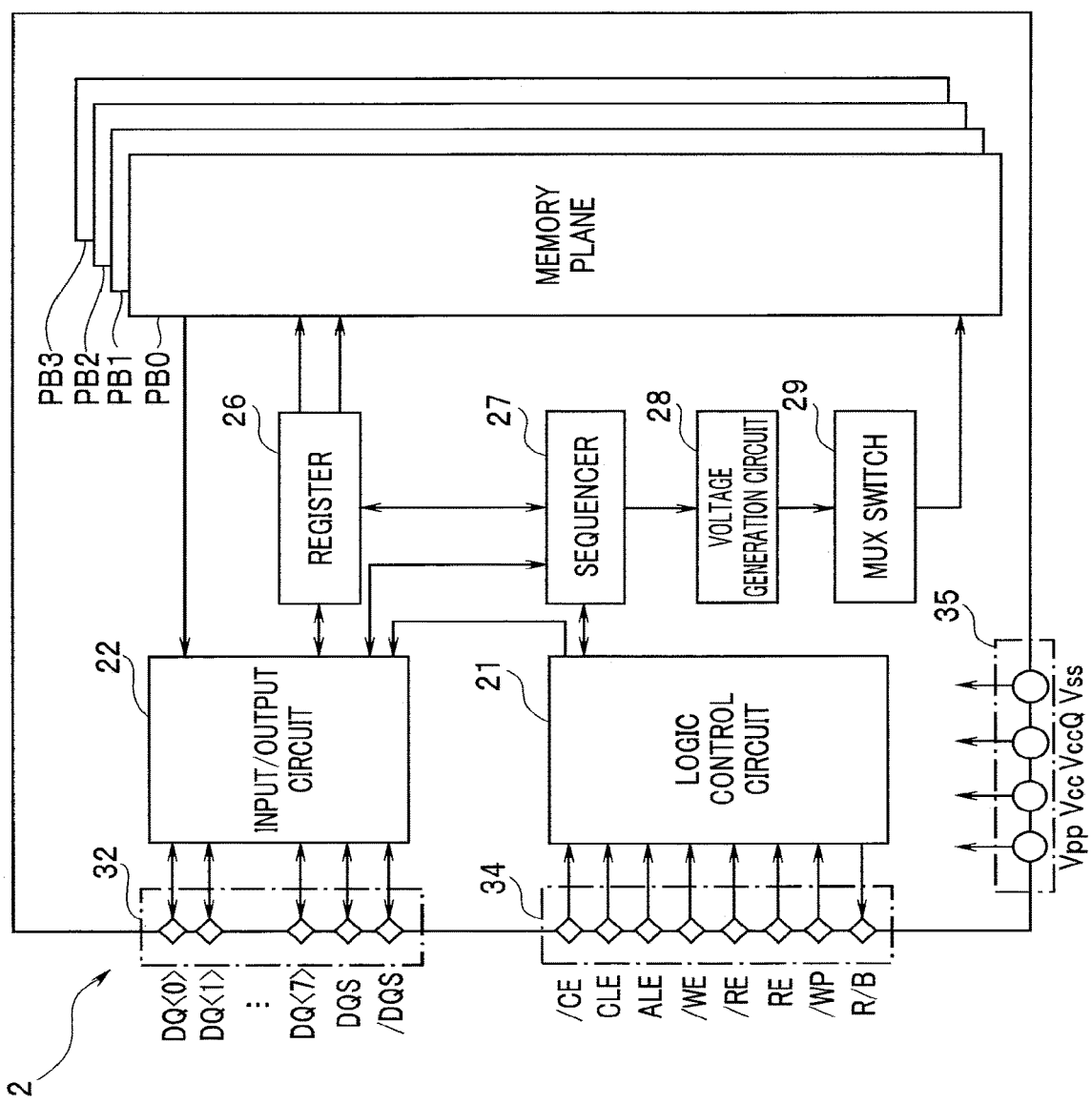
FIG. 2 is a block diagram showing a configuration example of a nonvolatile memory in the first embodiment.
Figure 3:
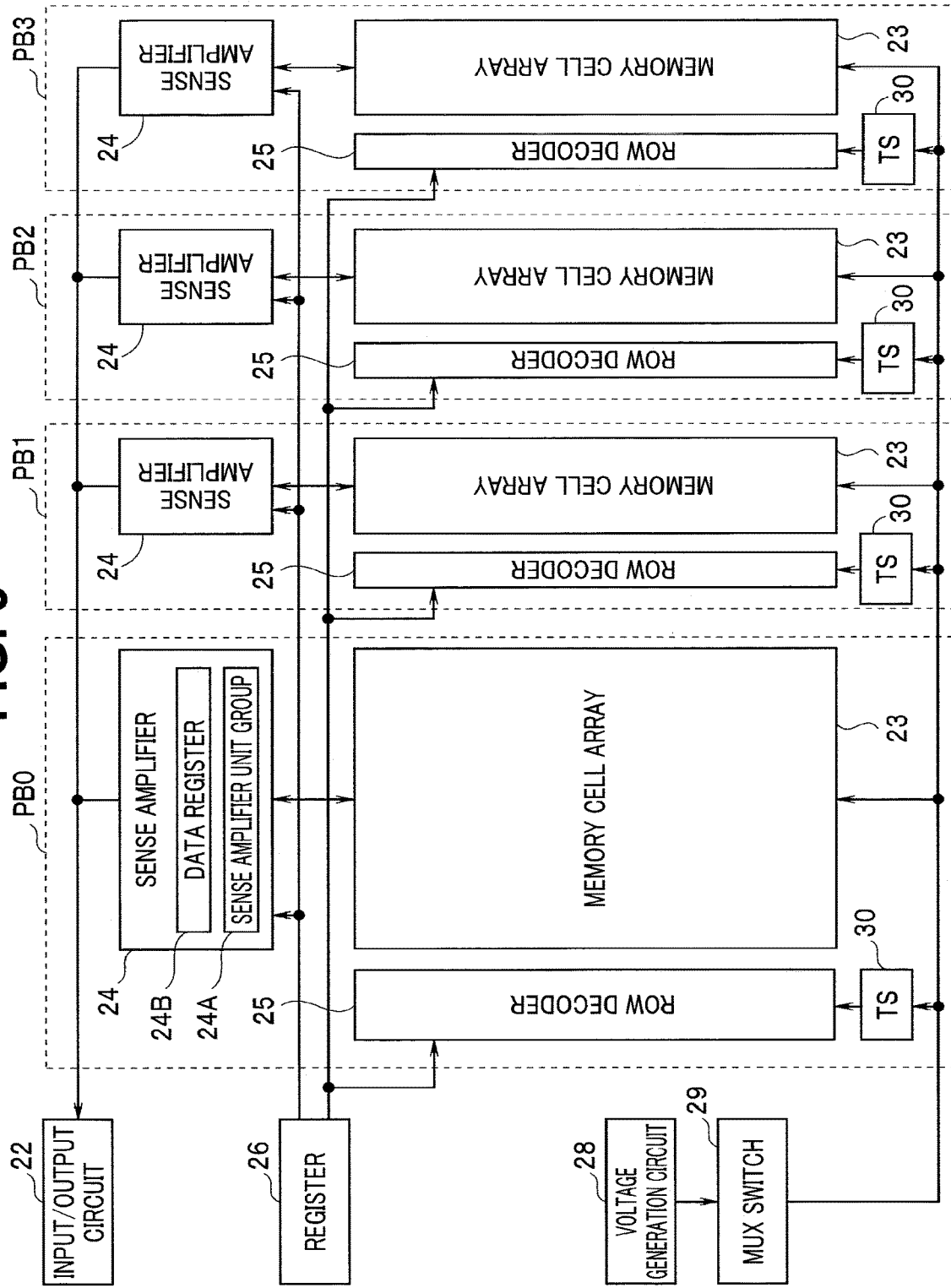
FIG. 3 is a block diagram showing an example of a specific configuration of a plurality of planes shown in FIG. 2.

FIG. 2 is a block diagram showing a configuration example of the nonvolatile memory in the present embodiment. FIG. 3 is a block diagram showing an example of a specific configuration of a plurality of planes shown in FIG. 2.

The nonvolatile memory 2 includes a logic control circuit 21, an input/output circuit 22, a register 26, a sequencer 27, a voltage generation circuit 28, a MUX switch 29, an input/output pad group 32, a logic control pad group 34, a power source inputting terminal group 35, and a plurality of planes PB0, PB1, . . . (hereinafter referred to as planes PB when it is unnecessary to distinguish the planes PB0, PB1, . . . ). Note that, in FIG. 2, an example is shown in which the number of planes of the planes PB is four. However, the number of planes included in the nonvolatile memory 2 is not limited to this. For example, the number of planes included in the nonvolatile memory 2 may be two, three, eight, sixteen, or the like.

The input/output pad group 32 includes a plurality of terminals (pads) corresponding to a signal DQ<7:0> and data strobe signals DQS and /DQS in order to perform transmission and reception of respective signals including data to and from the memory controller 1.

The logic control pad group 34 includes a plurality of terminals (pads) corresponding to a chip enable signal /CE, a command latch enable signal CLE, an address latch enable signal ALE, a write enable signal /WE, read enable signals RE and /RE, a write protect signal /WP, and a signal R/B in order to perform transmission and reception of respective signals to and from the memory controller 1.

The signal /CE enables selection of the nonvolatile memory 2. The signal CLE enables a command transmitted as the signal DQ to be latched to a command register. The signal ALE enables an address transmitted as the signal DQ to be latched to an address register. The signal /WE enables writing. The signals RE and /RE enable readout. The signal /WP prohibits writing and erasing. The signal R/B indicates whether the nonvolatile memory 2 is in a ready state (a state in which the nonvolatile memory 2 is capable of receiving a command from an outside) or in a busy state (a state in which the nonvolatile memory 2 cannot receive a command from the outside). The memory controller 1 can learn a state of the nonvolatile memory 2 by receiving the signal R/B.

The power source inputting terminal group 35 includes a plurality of terminals, to which power supply voltages Vcc, VccQ, and Vpp and a ground voltage Vss are inputted, in order to supply various operation power supplies. The power supply voltage Vcc is a circuit power supply voltage generally applied from the outside as an operation power supply and is, for example, a voltage of approximately 3.3 V. The power supply voltage VccQ is, for example, a voltage of 1.2 V. The power supply voltage VccQ is used when a signal is transmitted and received between the memory controller 1 and the nonvolatile memory 2. The power supply voltage Vpp is a power supply voltage higher than the power supply voltage Vcc and is, for example, a voltage of 12 V.

The logic control circuit 21 and the input/output circuit 22 are connected to the memory controller 1 via a NAND bus. The input/output circuit 22 transmits and receives the signal DQ (for example, DQ0 to DQ7) to and from the memory controller 1 via the NAND bus.

The logic control circuit 21 receives external control signals (for example, the chip enable signal /CE, the command latch enable signal CLE, the address latch enable signal ALE, the write enable signal /WE, the readout enable signals RE and/RE, and the write protect signal /WP) from the memory controller 1 via the NAND bus. "/" added to the signal names indicates active row. The logic control circuit 21 transmits the ready/busy signal R/B to the memory controller 1 via the NAND bus.

The register 26 includes a command register, an address register, and a status register. The command register temporarily stores a command. The address register temporarily stores an address. The status register temporarily stores data necessary for operation of the nonvolatile memory 2. The register 26 is configured of, for example, an SRAM.

The sequencer 27 functioning as a control circuit receives a command from the register 26 and controls the nonvolatile memory 2 according to a sequence based on the command.

The voltage generation circuit 28 receives a power supply voltage from the outside of the nonvolatile memory 2 and generates a plurality of voltages necessary for a writing operation, a readout operation, and an erasing operation using the power supply voltage. The voltage generation circuit 28 supplies the generated voltages to memory cell arrays 23, sense amplifiers 24, row decoders 25, and the like in the planes PB via the MUX switch 29.

The memory cell arrays 23 are respectively provided in the respective planes PB. Each of the memory cell arrays 23 includes a plurality of blocks. Each of the plurality of blocks BLK includes a plurality of memory cell transistors (memory cells). In the memory cell array 23, a plurality of bit lines, a plurality of word lines, a source line, and the like are disposed in order to control a voltage applied to the memory cell transistors.

(Block Configuration of the Memory Cell Array)

Figure 4A:
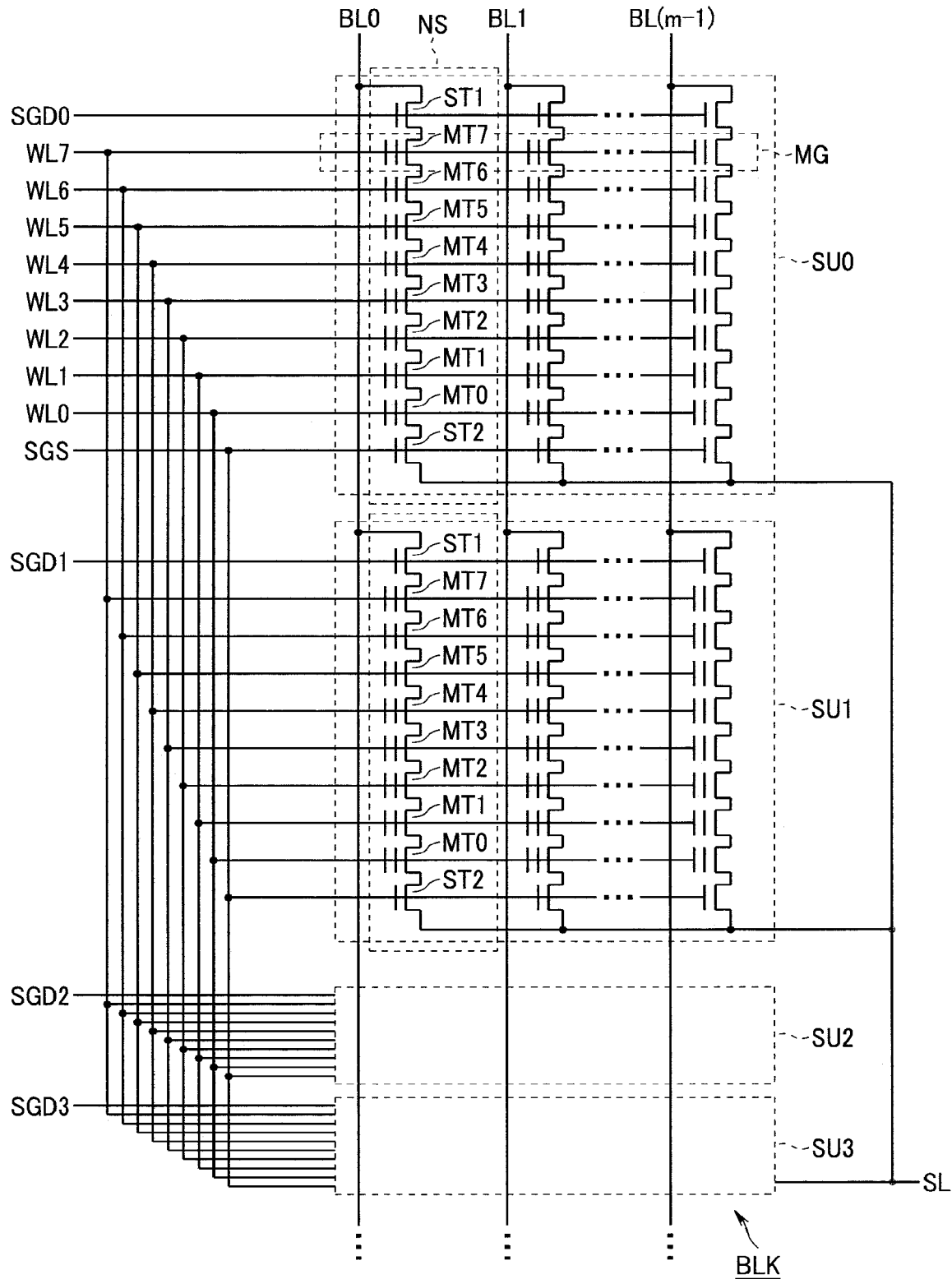
FIG. 4A is a diagram showing an equivalent circuit of a block of a NAND memory cell array having a three-dimensional structure.

FIG. 4A is a diagram showing an equivalent circuit of a block BLK of the NAND memory cell array 23 having a three-dimensional structure in the nonvolatile memory 2 in the present embodiment. FIG. 4A shows one block BLK among a plurality of blocks configuring the memory cell array 23. Other blocks of the memory cell array include the same configuration as the configuration shown in FIG. 4A. Note that the present embodiment is applicable to a memory cell array having a two-dimensional structure as well.

As shown in FIG. 4A, the block BLK includes, for example, four string units (SU0 to SU3). Each of the string units SU includes a plurality of NAND strings NS. Each of the NAND strings NS includes eight memory cell transistors MT (MT0 to MT7) and selection gate transistors ST1 and ST2. Note that the number of the memory cell transistors MT included in the NAND string NS is eight but is not limited to eight and may be, for example, thirty-two, forty-eight, sixty-four, and ninety-six. Each of the selection gate transistors ST1 and ST2 is shown as one transistor on an electric circuit but may be the same as the memory cell transistors in structure. For example, in order to improve a cutoff characteristic, a plurality of selection gate transistors may be used as each of the selection gate transistors ST1 and ST2. Further, dummy cell transistors may be provided between the memory cell transistors MT and the selection gate transistors ST1 and ST2.

The memory cell transistors MT are disposed to be connected in series between the selection gate transistors ST1 and ST2. The memory cell transistor MT7 on one end side is connected to the selection gate transistor ST1. The memory cell transistor MT0 on the other end side is connected to the selection gate transistor ST2.

Gates of the selection gate transistors ST1 of the string units SU0 to SU3 are respectively connected to the selection gate lines SGD0 to SGD3 (hereinafter referred to as selection gate lines SGD when it is unnecessary to distinguish the selection gate lines SGD0 to SGD3). On the other hand, gates of the selection gate transistors ST2 are connected in common to the same selection gate line SGS among a plurality of string units SU present in the same block BLK. Gates of the memory cell transistors MT0 to MT7 present in the same block BLK are respectively connected in common to word lines WL0 to WL7. In other words, whereas the word lines WL0 to WL7 and the selection gate line SGS are connected in common among the plurality of string units SU0 to SU3 in the same block BLK, the selection gate lines SGD are independent for each of the string units SU0 to SU3 even in the same block BLK.

The word lines WL0 to WL7 are respectively connected to the gates of the memory cell transistors MT0 to MT7 configuring the NAND string NS. Gates of memory cell transistors MTi present in the same row in the block BLK are connected to the same word line WLi. Note that, in the following explanation, the NAND string NS is sometimes simply referred to as "string".

The respective NAND strings NS are connected to bit lines corresponding to the NAND strings NS. Therefore, the respective memory cell transistors MT are connected to bit lines via the selection gate transistors ST and the other memory cell transistors MT included in the NAND strings NS. As explained above, data of the memory cell transistors MT present in the same block BLK are collectively erased. On the other hand, data readout and writing are performed in a memory cell group MG unit (or a page unit). In this specification, a plurality of memory cell transistors MT connected to one word line WLi and belonging to one string unit SU are defined as a memory cell group MG. In the present embodiment, the nonvolatile memory 2 is a NAND memory of QLC capable of storing 4-bit (hexadecimal) data. Therefore, one memory cell group MG can store data for four pages. Four bits that the respective memory cell transistors MT can store respectively correspond to the four pages.

Figure 4B:
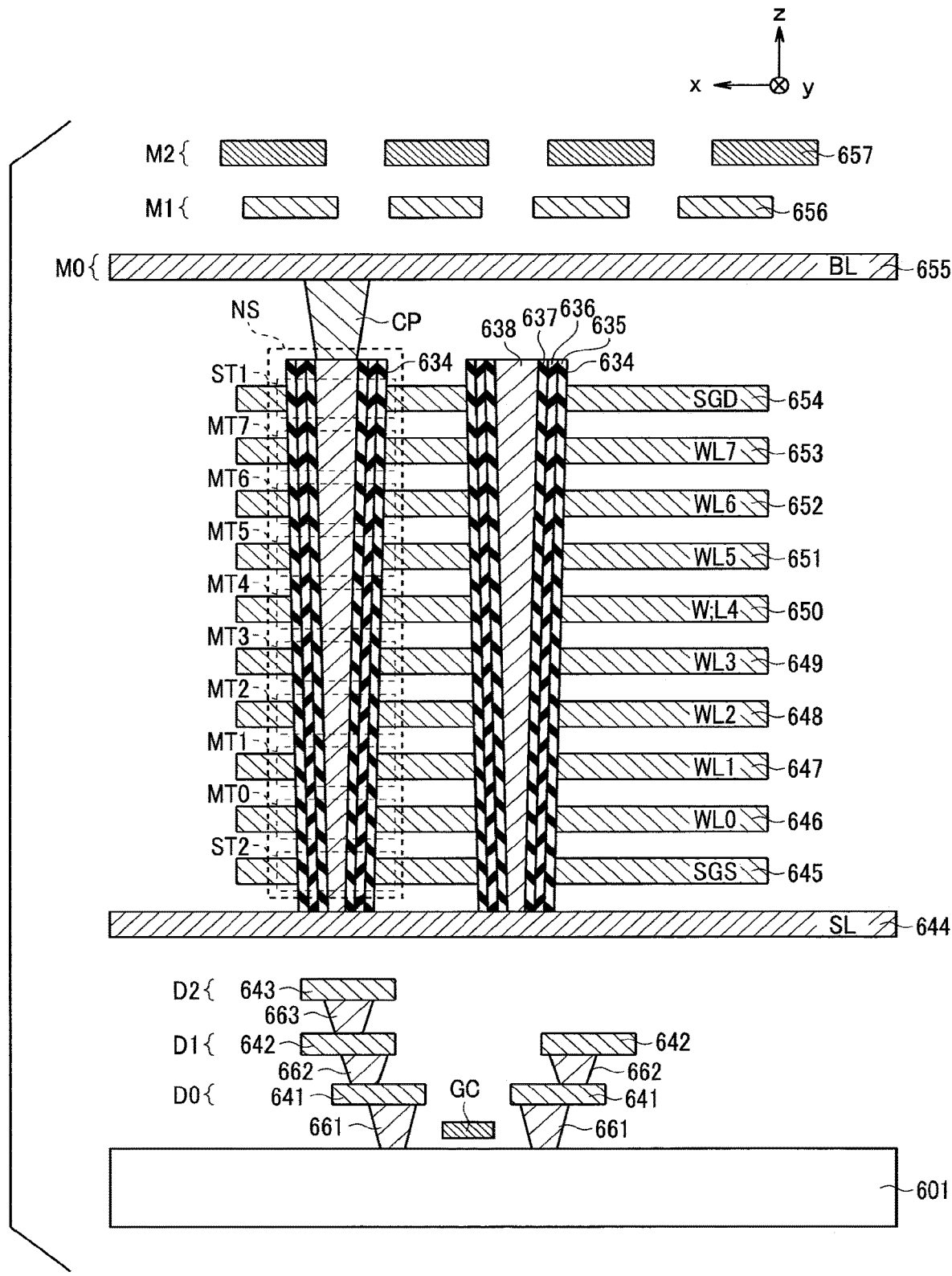
FIG. 4B is a diagram showing a configuration example of the block of the NAND memory cell array having the three-dimensional structure.

FIG. 4B is a diagram showing a configuration example of the block BLK of the NAND memory cell array 23 having the three-dimensional structure in the nonvolatile memory 2 in the present embodiment. FIG. 4B shows one block BLK among a plurality of blocks configuring the memory cell array 23. The other blocks of the memory cell array include the same configuration as the configuration shown in FIG. 4B.

More specifically, FIG. 4B is a partial sectional view of the block BLK of the NAND memory cell array 23 in the nonvolatile memory 2 in the present embodiment. As shown in FIG. 4B, transistors included in peripheral circuits such as the sense amplifier 24 and the row decoder 25 are formed on a semiconductor substrate 601. Memory cell transistors included in the memory cell array 23 are formed in upper layers of the transistors. In the following explanation, orthogonal two directions parallel to a surface of the semiconductor substrate 601 are represented as an x direction and a y direction and a direction perpendicular to the surface of the semiconductor substrate 601 is represented as a z direction.

In FIG. 4B, illustration of each of p type or n type well regions formed in an upper surface portion of the semiconductor substrate 601, impurity diffusion regions formed in the respective well regions, and element separation regions insulating the well regions is omitted. A conductor GC is provided on the semiconductor substrate 601 via a gate insulating film (not illustrated). A plurality of contacts 661 are provided in a plurality of impurity diffusion regions (not illustrated) provided to sandwich the conductor GC on the semiconductor substrate 601. A plurality of conductors 641 functioning as wiring patters are respectively connected to the plurality of contacts 661. For example, the conductor GC functions as a gate electrode of the transistor. The conductors 641 function as source electrodes or drain electrodes of the transistor.

For example, contacts 662 are provided on the conductors 641, conductors 642 functioning as wiring patterns are connected to the contacts 662, a contact 663 is provided on the conductor 642, and a conductor 643 functioning as a wiring pattern is connected to the contact 663. Wiring layers in which the conductors 641, 642, and 643 are provided are respectively referred to as wiring layers D0, D1, and D2. The wiring layers D0, D1, and D2 are provided in a lower layer portion of the nonvolatile memory 2. Note that wiring layers provided in the lower layer portion of the nonvolatile memory 2 are not limited to three layers. The wiring layers may be configured by two or less wiring layers. Alternatively, four or more wiring layers may be provided.

Above the conductor 643, for example, a conductor 644 is provided via an interlayer insulating film (not illustrated). The conductor 644 is formed in, for example, a plate shape parallel to an xy plane and functions as a source line SL. Above the conductor 644, for example, conductors 645 to 654 are stacked in order in a z direction via inter-layer insulating films (not illustrated).

Each of the conductors 645 to 654 is formed in, for example, a plate shape parallel to the xy plane. For example, the conductor 645 functions as the selection gate line SGS, the conductors 646 to 653 respectively function as the word lines WL0 to WL7, and the conductor 654 functions as the selection gate line SGD.

A columnar memory pillar 634 is provided to pierce through each of the conductors 645 to 654 and come into contact with the conductor 644. The memory pillar 634 includes, for example, a conductor post 638 on a center side, a tunnel insulating film 637 formed on an outer side of the conductor post 638, a charge accumulating film 636 formed on the outer side of the tunnel insulating film 637, and a block insulating film 635 formed on the outer side of the charge accumulating film 636. A portion where the memory pillar 634 and each of the conductors 646 to 654 cross functions as the memory cell transistor (memory cell) MT. A portion where the memory pillar 634 and each of the conductors 645 and 654 cross functions as the selection transistor ST.

A conductor 655 is provided in an upper layer above an upper surface of the memory pillar 634 via an interlayer insulating film (not illustrated). The conductor 655 is formed in a line shape extending in the x direction and functions as the bit line BL. A plurality of conductors 655 are arrayed at an interval in the y direction. The conductor 655 is electrically connected to, via a contact plug CP, the conductor post 638 in one memory pillar 634 corresponding to each of string units SU.

More specifically, in the respective string units SU, for example, the contact plug CP is provided on the conductor posts 638 in the respective memory pillars 634. One conductor 645 is provided on the contact plug CP. Note that, without being limited to such a configuration, for example, the conductor post 638 and the conductor 655 may be further connected via a plurality of contacts, wires, and the like.

A conductor 656 is provided, via an interlayer insulating film (not illustrated), in an upper layer above the layer in which the conductor 655 is provided. A conductor 657 is provided, via an interlayer insulating film (not illustrated), in an upper layer above the layer in which the conductor 656 is provided.

The conductors 656 and 657 function as wires for connecting, for example, wires provided in the memory cell array 23 and a peripheral circuit provided in a lower layer of the memory cell array 23. The layers in which the conductors 655, 656, and 657 are provided are respectively referred to as wiring layers M0, M1, and M2.

The planes PB0 to PB3 shown in FIG. 3 include the same configuration one another and include the memory cell array 23, the sense amplifier 24, the row decoder 25, and a plane decoder (hereinafter referred to as TS) 30.

The row decoder 25 receives a row address from the register 26 and decodes the row address. The row decoder 25 performs a word line selecting operation based on the decoded row address. The row decoder 25 transfers, to a selected block, a plurality of voltages necessary for a writing operation, a readout operation, and an erasing operation.

The sense amplifier 24 receives a column address from the register 26 and decodes the column address. The sense amplifier 24 includes a sense amplifier unit group 24A connected to respective bit lines. The sense amplifier unit group 24A selects any bit line based on the decoded column address. During readout of data, the sense amplifier unit group 24A detects and amplifies data read out to the bit lines from the memory cell transistor. During writing of data, the sense amplifier unit group 24A transfers write data to the bit lines.

The sense amplifier 24 includes a data register 24B. During readout of data, the data register 24B temporarily stores data detected by the sense amplifier unit group 24A and serially transfers the data in the input/output circuit 22. During writing of data, the data register 24B temporarily stores data serially transferred from the input/output circuit 22 and transfers the data to the sense amplifier unit group 24A. The data register 24B is configured by an SRAM or the like.

Voltages used by the memory cell array 23, the sense amplifier 24, and the row decoder 25 in writing and readout are generated by the voltage generation circuit 28. In other words, the voltage generation circuit 28 generates various voltages necessary during writing, various voltages necessary for readout, and various voltages necessary for erasing and outputs the various voltages to the MUX switch 29. The MUX switch 29 switches, according to a sequence of writing and readout, wires to which the various voltages generated by the voltage generation circuit 28 are supplied.

(Writing Operation)

Data writing operation in the memory cell MT roughly includes a program operation and a verify operation. The program operation means an operation for raising a threshold voltage of the memory cell MT by injecting electrons into a charge accumulating film (or maintaining the threshold voltage by prohibiting the injection).

Figure 5:
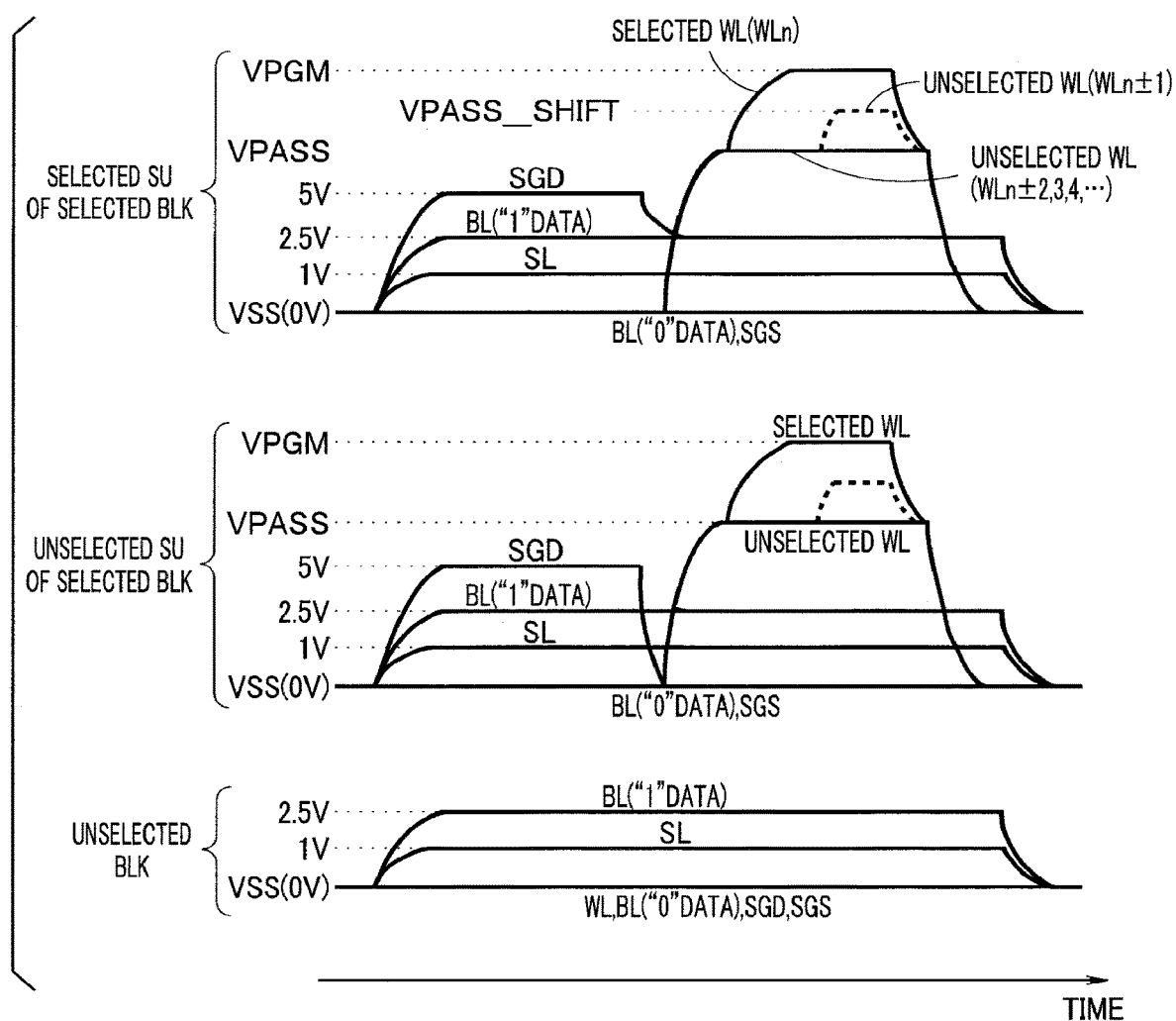
FIG. 5 is a diagram showing voltage changes of respective wires in a writing operation (a program operation)

FIG. 5 is a diagram showing voltage changes of respective wires in the writing operation (the program operation). The voltage generation circuit 28 generates the various voltages shown in FIG. 5. The MUX switch 29 is controlled by the sequencer 27 and allocates the various voltages shown in FIG. 5 to the respective wires.

The program operation is performed according to a program voltage and a bit line voltage applied to word lines and bit lines. As shown in FIG. 5, the block BLK in which a program voltage VPGM is not applied to word lines (selected WL and unselected WL in FIG. 5) is unselected BLK (a lower part of FIG. 5), which is not a writing target. A bit line voltage is applied to the memory cell transistor MT when the selection gate transistor ST1 connected to the bit line BL conducts. Therefore, the string unit SU to which the selection gate line SGD is not applied in the writing target block BLK (the selected BLK) is unselected SU (a middle part in FIG. 5), which is not a writing target. Note that, about unselected SU (the middle part in FIG. 5) of selected BLK, before the application of the program voltage VPGM, the selection gate line SGD may be set to, for example, 5 V to cause the selection gate transistor ST1 to conduct.

About the writing target string unit SU (selected SU) (an upper part of FIG. 5) of the writing target block BLK (selected BLK), before the application of the program voltage VPGM, as shown on a left side in the upper part of FIG. 5, the selection gate line SGD is set to, for example, 5 V to cause the selection gate transistor ST1 to conduct. During the program operation, the selection gate line SGS has, for example, 0 V. Therefore, the selection gate transistor ST2 is turned off. On the other hand, during application of the program voltage VPGM shown on a right side of the upper part of FIG. 5, the selection gate line SGD is set to, for example, 2.5 V. Consequently, a state of conduction or nonconduction of the selection gate transistor ST1 is determined according to a bit line voltage of the bit line BL connected to the selection gate transistor ST1.

As explained above, the sense amplifier 24 transfers data to the respective bit lines BL. The ground voltage Vss of, for example, 0 V is applied to, as a bit line voltage Vb1_L, the bit line BL to which "0" data is given. A write prohibit voltage Vinhibit (for example, 2.5 V) is applied to, as a bit line voltage Vb1_H, the bit line BL to which "1" data is given. Therefore, during the program voltage VPGM application, the selection gate transistor ST1 connected to the bit line BL to which the "0" data is given conducts and the selection gate transistor ST1 connected to the bit line BL to which the "0" data is given is cut off. The memory cell transistor MT connected to the cut-off selection gate transistor ST1 is write-prohibited.

In the memory cell transistor MT connected to the selection gate transistor ST1 in the conduction state, injection of electrons into a charge accumulating film is performed according to a voltage applied to the word line WL. The memory cell transistor MT connected to the word line WL (unselected WL) to which a voltage VPASS is applied as a word line voltage is in the conduction state irrespective of the threshold voltage. However, injection of electrons into the charge accumulating film is not performed. On the other hand, in the memory cell transistor MT connected to the word line WL (selected WL) to which the program voltage VPGM is applied as the word line voltage, injection of electrons into the charge accumulating film is performed according to the program voltage VPGM.

In other words, the row decoder 25 selects any word line WL in the selected block BLK, applies the program voltage VPGM to the selected word line (selected WL), and applies the voltage VPASS, which is a first intermediate voltage, to the other word lines (unselected word lines) WL (unselected WL). The program voltage VPGM is a high voltage for injecting electrons into the charge accumulating film with a tunnel phenomenon and VPGM>VPASS. By controlling a voltage of the word line WL with the row decoder 25 and supplying data to the respective bit lines BL with the sense amplifier 24, the writing operation (the program operation) to the respective memory cell transistors MT of the memory cell array 23 is performed.

(VPASS_SHIFT)

In order to suppress a decrease of the program voltage VPGM applied to a channel, in a latter half of a program voltage application period, VPASS_SHIFT for raising the voltage VPASS, which is applied to an unselected word line adjacent to a selected word line (hereinafter referred to as adjacent word line), to a voltage VPASS_SHIFT, which is a second intermediate voltage, is sometimes adopted. A voltage of the adjacent word line is shifted from VPASS to the voltage VPASS_SHIFT to, for example, boost the program voltage VPGM of the selected word line and improve program efficiency. A channel voltage of the NAND string NS, to which a non-writing target memory cell transistor MT belongs, is raised to suppress disturb.

A channel of unselected SU is floating. Therefore, a channel voltage of unselected SU rises even when a high voltage VPGM is applied to the selected word line. Therefore, originally, writing is not performed in the memory cell transistor MT of unselected SU. However, if the channel voltage of unselected SU decreases because of a leak of electric charges, erroneous writing is likely to be performed in the memory cell transistor MT of unselected SU by application of the program voltage VPGM. Accordingly, the voltage of the adjacent word line is raised from VPASS to the voltage VPASS_SHIFT to increase the channel voltage of unselected SU and prevent writing from being performed in the memory cell transistor MT of unselected SU. In other words, VPASS_SHIFT has a function of preventing disturb (erroneous writing due to an unintended rise of the threshold voltage).

(Threshold Voltage Distributions)

When multi-value data is written in the memory cell transistor MT, the threshold voltage of the memory cell transistor MT is set to a value corresponding to a value of the data. When the program voltage VPGM and a bit line voltage Vb1 are applied to the memory cell transistor MT, electrons are injected into the charge accumulating film of the memory cell transistor MT and the threshold voltage rises. It is possible to increase an injection amount of the electrons by increasing the program voltage VPGM and increase the threshold voltage of the memory cell transistor MT. However, even if the same program voltage VPGM is applied, the injection amount of the electrons is different for each of the memory cell transistors MT because of fluctuation in the memory cell transistors MT. The electrons once injected are stored until the erasing operation is performed. Therefore, the program voltage VPGM is gradually raised and the program operation and the verify operation (a loop) are performed a plurality of times such that the program voltage VPGM is fit in a range of a threshold voltage allowable as the threshold voltage that should be set in the respective memory cell transistors MT. The verify operation is a readout operation performed as a part of the writing operation.

Figure 6:
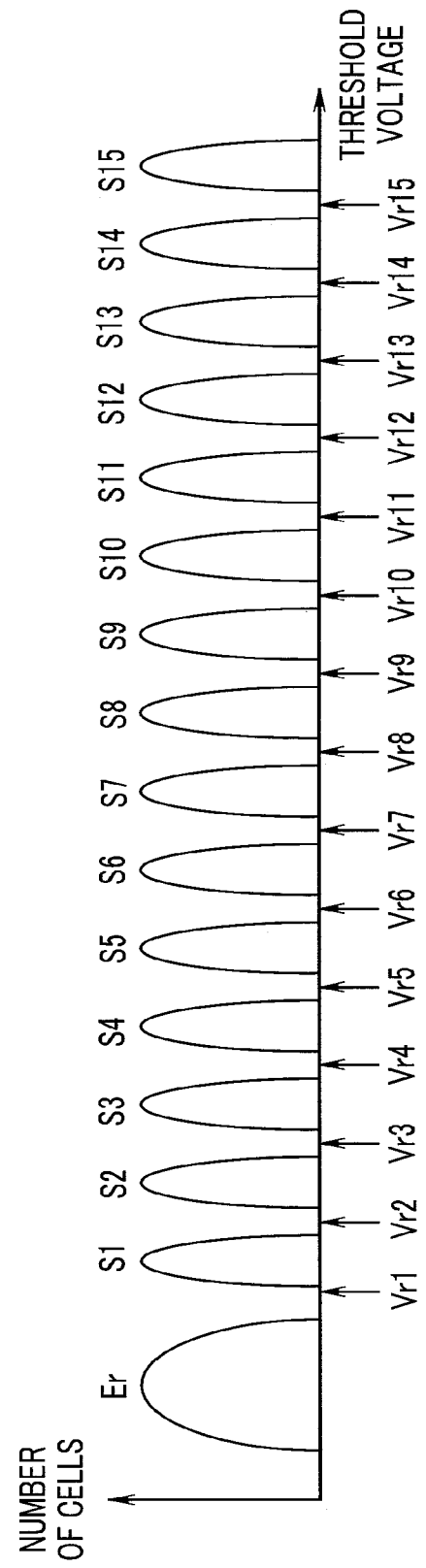
FIG. 6 is a diagram showing threshold voltage distributions of a memory cell array.

FIG. 6 is a diagram showing threshold voltage distributions of the memory cell array. In FIG. 6, a threshold voltage distribution example of the 4-bit/Cell nonvolatile memory 2 is shown. In the nonvolatile memory 2, a threshold voltage of the memory cell MT is set according to respective data values of multi-value data stored in the memory cell MT. Since injection of a charge amount into the charge accumulating film (a charge storage region) is probabilistic, as shown in FIG. 6, threshold voltages of the respective memory cells MT are statistically distributed.

FIG. 6 shows sixteen lobe-shaped threshold voltage distributions corresponding to sixteen states (states Er and S1 to S15) corresponding to 4-bit hexadecimal with a threshold voltage plotted on a horizontal axis and the number of memory cells (the number of cells) plotted on a vertical axis. In an example shown in FIG. 6, by setting the threshold voltage of the memory cell MT in any one of the sixteen threshold voltage distributions corresponding to the sixteen states, it is possible to store hexadecimal data (4-bit data) in the memory cell MT.

A threshold voltage distribution in which a threshold voltage Vth is equal to or smaller than a voltage Vr1 in FIG. 6 corresponds to the state Er. A threshold voltage distribution in which the threshold voltage Vth is larger than the voltage Vr1 and equal to or smaller than a voltage Vr2 corresponds to the state S1. A threshold voltage distribution in which the threshold Vth is larger than the voltage Vr2 and equal to or smaller than a voltage Vr3 corresponds to the state S2. A threshold voltage distribution in which the threshold voltage Vth is larger than the voltage Vr3 and equal to or smaller than a voltage Vr4 corresponds to the state S3. Similarly, as shown in FIG. 6, respective threshold voltage distributions correspond to states S4 to S15.

In other words, the states indicate the threshold voltages Vth of the respective memory cells MT. In the case of 4-bit hexadecimal, the threshold voltages Vth of the respective memory cells MT are set to any ones of the sixteen threshold voltage distributions corresponding to the sixteen states of the states Er and S1 to S15. Voltages Vr1 to Vr15 are reference voltages forming boundaries among the respective sixteen threshold voltage distributions. Note that, in the verify operation, the voltages Vr1 to Vr15 are applied to the word line WL as a verify voltage to perform readout. It is determined that threshold voltages of target memory cells MT have reached the threshold voltages corresponding to the states when the target memory cells MT are turned off.

Figure 7:
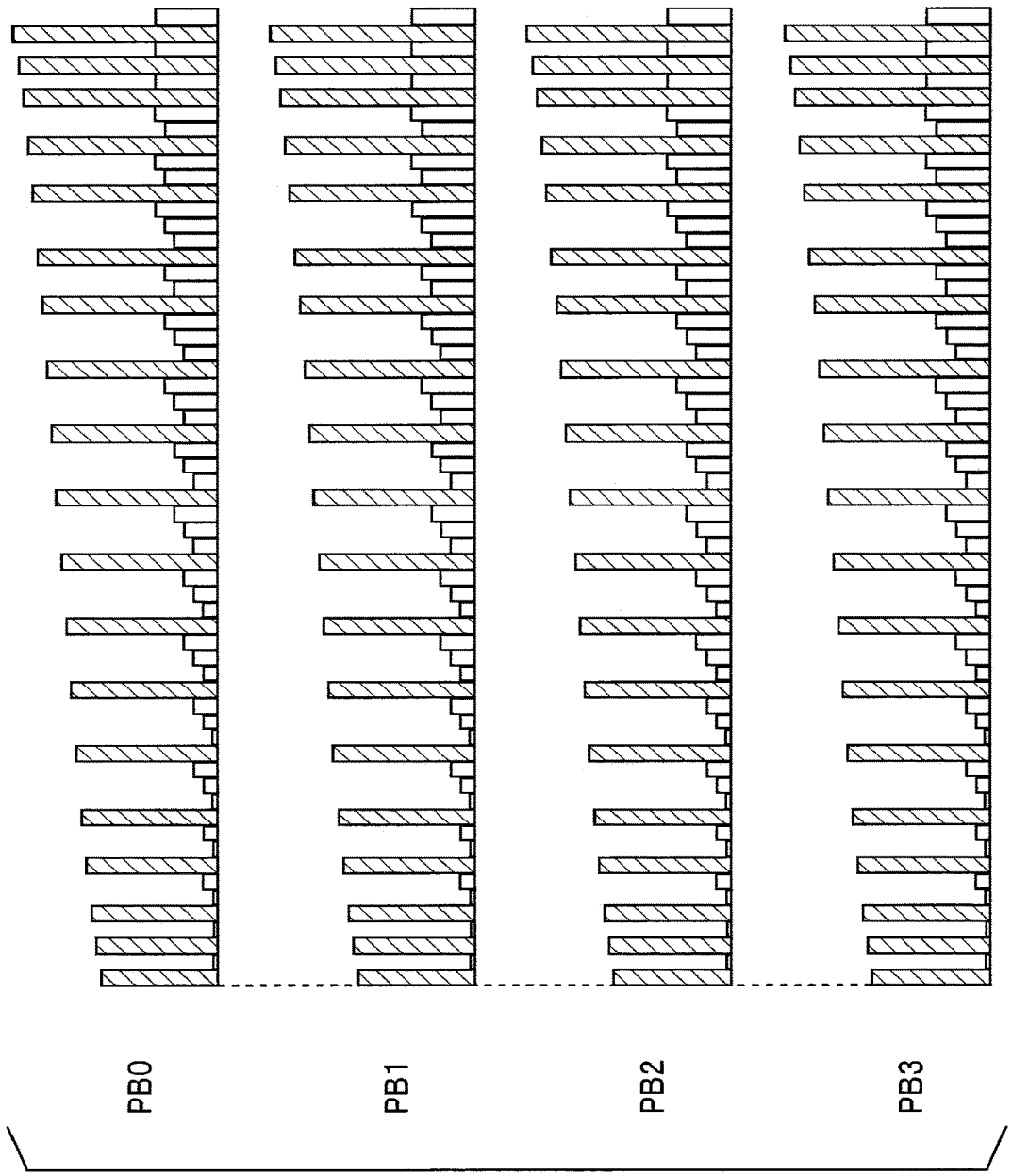
FIG. 7 is an explanatory diagram showing a standard writing sequence in the writing operation.

FIG. 7 is an explanatory diagram showing a standard writing sequence in the writing operation. FIG. 7 shows changes of the program voltage VPGM and timings of the program operation and the verify operation during the writing operation based on the standard writing sequence with a time plotted on a horizontal axis and a voltage plotted on a vertical axis.

FIG. 7 shows writing sequences in the planes PB1 to PB3. Hatching in FIG. 7 indicates changes of the program voltage VPGM during writing. In other words, FIG. 7 shows an example of a nineteen-loop writing sequence for changing the program voltage VPGM nineteen times to perform writing. The writing sequences of the respective planes PB are carried out in synchronization with one another.

As shown in FIG. 7, in the standard writing sequence, the program voltage VPGM applied to the selected word line WL is sequentially increased for each of loops. In the respective loops, the verify operation is performed targeting one or more states in order to determine whether the threshold voltages Vth of the respective memory cells MT as a result of writing have reached a value higher than the verify voltage. In an example shown in FIG. 7, finally, nineteen times of the program operation and forty-two times of the verify operation are performed in a maximum nineteen times of loops.

(Voltage Generation Circuit)

Figure 8:
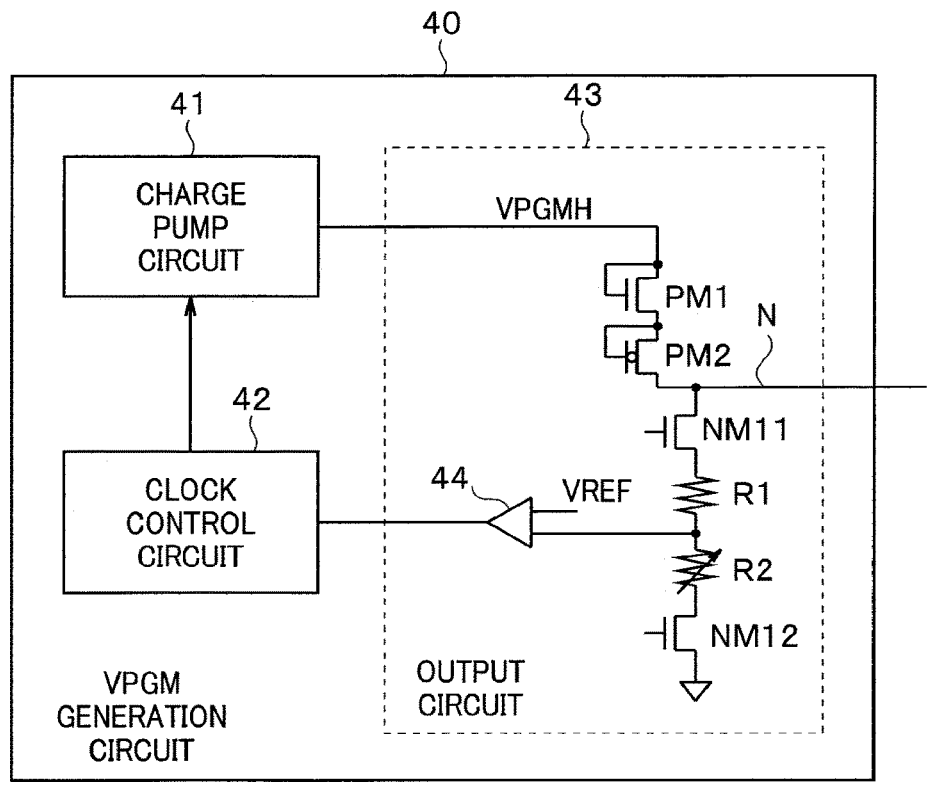
FIG. 8 is a block diagram showing an example of a specific configuration of a VPGM generation circuit configuring a voltage generation circuit shown in FIG. 2 or FIG. 3.
Figure 9:
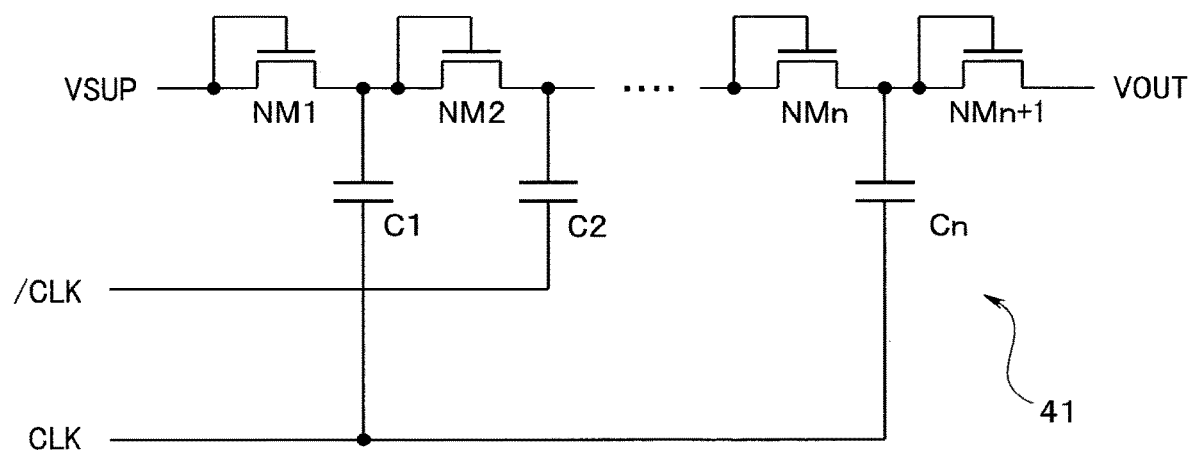
FIG. 9 is a circuit diagram showing an example of a specific configuration of a charge pump circuit shown in FIG. 8.

FIG. 8 is a block diagram showing an example of a specific configuration of a VPGM generation circuit 40 configuring the voltage generation circuit 28 shown in FIG. 2 or FIG. 3. FIG. 9 is a circuit diagram showing an example of a specific configuration of a charge pump circuit 41 in FIG. 8.

A clock control circuit 42 generates a clock signal CLK and a clock signal /CLK, which is an inverted signal of the clock signal CLK. The clock control circuit 42 supplies complementary clocks CLK and /CLK to the charge pump circuit 41. The charge pump circuit 41 generates a predetermined voltage VOUT using the clocks CLK and /CLK supplied from the clock control circuit 42.

As shown in FIG. 9, the charge pump circuit 41 includes n+1 NMOS transistors NM1, NM2, . . . , NMn, and NMn+1 and n capacitors C1 to Cn. Note that a number n of NMOS transistors and capacitors in the charge pump circuit 41 can be set as appropriate.

The NMOS transistors NM1 to NMn+1 are respectively diode-connected and function as diodes. Current paths of the NMOS transistors NM1 to NMn+1 are connected in series in order. One ends of the capacitors C1 to Cn are respectively electrically connected to one ends on a current path output side of the NMOS transistors NM1 to NMn. The clock signal CLK is supplied to the other ends of the capacitors C1, C3, C5, . . . . The clock signal /CLK is supplied to the other ends of the capacitors C2, C4, C6, . . . .

A voltage VSUP (for example, a power supply voltage VDD) is supplied to one end on a current path input side of the NMOS transistor NM1. The capacitors C1 to Cn repeat charge and discharge with the clock signals CLK and/CLK having amplitude of the power supply voltage VDD. The input voltage VSUP is raised and sequentially transferred to later stages. As a result, an output voltage VOUT larger than the voltage VSUP is generated on the current path output side of the transistor NMn+1.

The charge pump circuit 41 can generate voltages at different levels in respective stages of the diode-connected NMOS transistors. The voltage generation circuit 28 generates a plurality of kinds of voltages necessary for the writing, the readout, and the like explained above from an output of the charge pump circuit 41.

In FIG. 8, among respective circuits configured in the voltage generation circuit 28, the VPGM generation circuit 40 that generates the program voltage VPGM using the output of the charge pump circuit 41 is shown. An output VOUT of the charge pump circuit 41 is supplied to an output circuit 43 as a voltage VPGMH. In the output circuit 43, two PMOS transistors PM1 and PM2, current paths of which are connected in series, are connected between a power supply line, through which the voltage VPGMH is supplied, and an output node N. A source and a gate of the transistor PM1 are connected to the power supply line. A source and a gate of the transistor PM2 of an I type are connected to a drain of the transistor PM1. The drain is connected to the output node N.

A current path of the NMOS transistors NM11, a resistor R1, a variable resistor R2, and a current path of the NMOS transistor NM12 are connected in series between the output node N and a reference voltage point. A connection point of the resistors R1 and R2 is connected to one input end of a comparator 44. A reference voltage VREF is applied to the other input end of the comparator 44. The comparator 44 outputs a stop signal to the clock control circuit 42 in a period in which a voltage at the connection point of the resistors R1 and R2 is higher than the reference voltage VREF. The clock control circuit 42 stops the generation of the clock signals CLK and /CLK in the period in which the stop signal is outputted from the comparator 44. A limit circuit is configured by the transistors NM11 and NM12, the resistors R1 and R2, and the comparator 44.

Both of the transistors PM1 and PM2 are diode-connected. The voltage VPGMH supplied to the output circuit 43 decreases by the threshold voltage of the transistors PM1 and PM2 and appears in the output node N. By setting, as the voltage VPGMH, a voltage higher than the program voltage VPGM by the threshold voltage of the transistors PM1 and PM2, it is possible to generate the program voltage VPGM from the output node N.

A control signal is supplied to the transistors NM11 and NM12 from the sequencer 27 (not illustrated). The transistors N11 and NM12 are turned on in a period for causing the limit circuit to function. In the period in which the transistors NM11 and NM12 are on, a voltage appearing in the output node N is divided by the resistors R1 and R2. The voltage at the connection point of the resistors R1 and R2 is compared with the reference voltage VREF in the comparator 44. The reference voltage VREF is set to a voltage at the connection point of the resistors R1 and R2 in a case where the voltage appearing in the output node N is a specified program voltage VPGM. Therefore, when the voltage appearing in the output node N exceeds the specified program voltage VPGM, the voltage at the connection point of the resistors R1 and R2 becomes higher than the reference voltage VREF. The stop signal is generated from the comparator 44. The clock control circuit 42 stops the generation of the clock signals CLK and /CLK according to the stop signal. As a result, an output voltage of the charge pump circuit 41 decreases, the voltage rise of the output node N is suppressed, and the voltage of the output node N is maintained at the specified program voltage VPGM.

(Floating Voltage)

Resistance values of the resistors R1 and R2 are set to sufficiently large resistance values to reduce an electric current flowing from the output node N to the reference voltage point in order to suppress an increase in power consumption. Accordingly, when a multi-plane operation targeting a plurality of planes is performed, floating voltage occurs in the program voltage VPGM. As a result, there is a defect in that a writing time increases.

Figure 10:
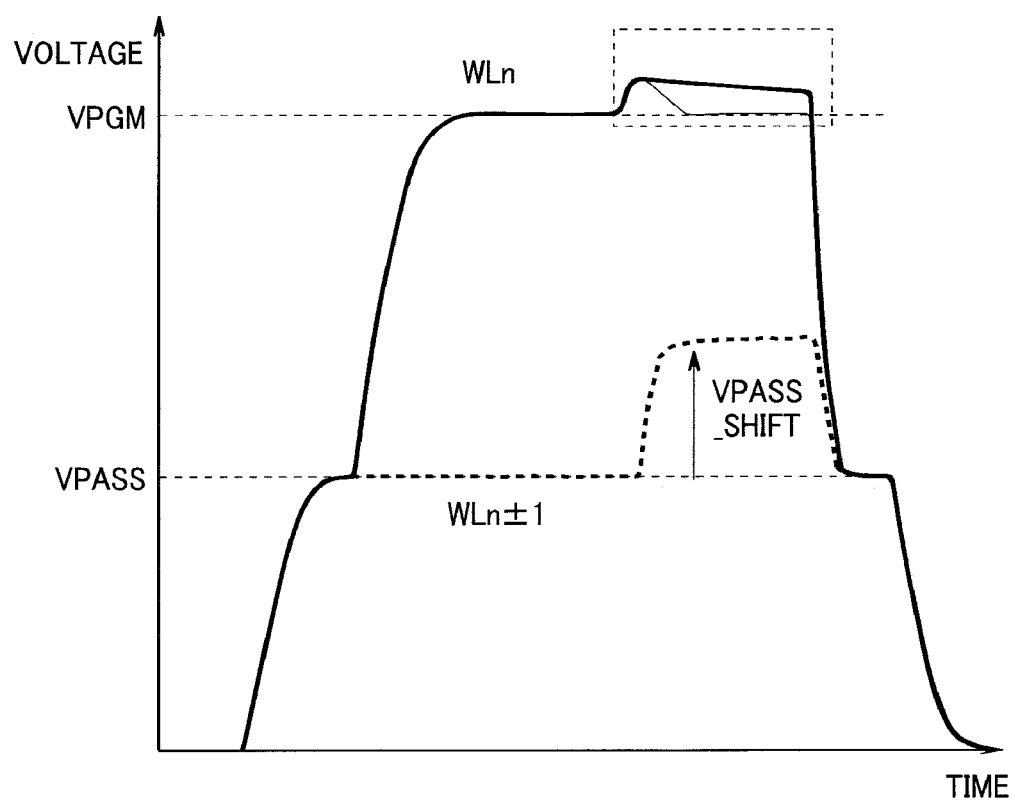
FIG. 10 is a graph for explaining floating voltage of a program voltage VPGM with a time plotted on a horizontal axis and a voltage plotted on a vertical axis.

FIG. 10 is a graph for explaining the floating voltage of the program voltage VPGM with a time plotted on a horizontal axis and a voltage plotted on a vertical axis. FIG. 10 shows a waveform (a thin solid line) of a voltage applied to a selected word line (WLn) when a program operation targeting a single plane is performed in the configuration shown in FIG. 2 and a waveform (a thick solid line) of a voltage applied to a selected word line (WLn) when a program operation targeting four planes is performed in the configuration shown in FIG. 2. Note that the thin solid line substantially overlaps the thick solid line except a portion surrounded by a broken line frame. A waveform (a broken line) of a voltage applied to an adjacent word line (WLn±1) is substantially the same when the program operation targeting the single plane is performed and when the program operation targeting the four planes is performed.

As indicated by the broken line in FIG. 10, in the adjacent word line (WLn±1), VPASS shifts to VPASS_SHIFT. According to a voltage rise to VPASS_SHIFT, as indicated by the thick solid line, the program voltage VPGM in the selected word line is boosted.

After the program voltage VPGM exceeds a desired voltage according to VPASS_SHIFT, in the case of the program operation targeting the single plane, the limit circuit of the VPGM generation circuit 40 operates. Discharge is performed little by little from the limit circuit to the reference voltage point through the TS 30, the MUX switch 29, and the output node N of the VPGM generation circuit 40 in the voltage generation circuit 28 from a selected word line of one plane. Consequently, the voltage of the selected word line (WLn) is stabilized at the program voltage VPGM.

In contrast, in the case of the multi-plane operation, after the program voltage VPGM in the selected word line (WLn) is boosted because VPASS rises to VPASS_SHIFT in the adjacent word line (WLn±1), even in a state in which the program voltage VPGM exceeds a voltage value that should be originally set, as explained above, a discharge amount by the limit circuit in the VPGM generation circuit 40 is small. Therefore, even if discharge is performed by the limit circuit from the respective selected word lines of the four planes PB0 to PB3 through the TSs 30 of the planes PB0 to PB3 via the MUX switch 29 and the output node N of the VPGM generation circuit 40 in the voltage generation circuit 28, as indicated by the thin solid line in FIG. 10, the voltage of the selected word line (WLn) cannot be sufficiently reduced to the program voltage VPGM. As a result, floating voltage indicated by a region surrounded by the broken line frame in FIG. 10 occurs. A state of the floating voltage is different depending on the number of simultaneously operating planes.

In other words, fluctuation is caused in a change of the program voltage VPGM by the number of simultaneously operating planes and affects the number of loops of a program. In this way, in the case of the multi-plane operation, as a result, a writing time increases.

(Configuration)

Therefore, in the present embodiment, a discharge circuit for reducing the program voltage VPGM is provided. Uniformization of program voltage VPGM is achieved irrespective of the number of simultaneously operating planes by controlling the discharge circuit according to VPASS_SHIFT.

Figure 11:
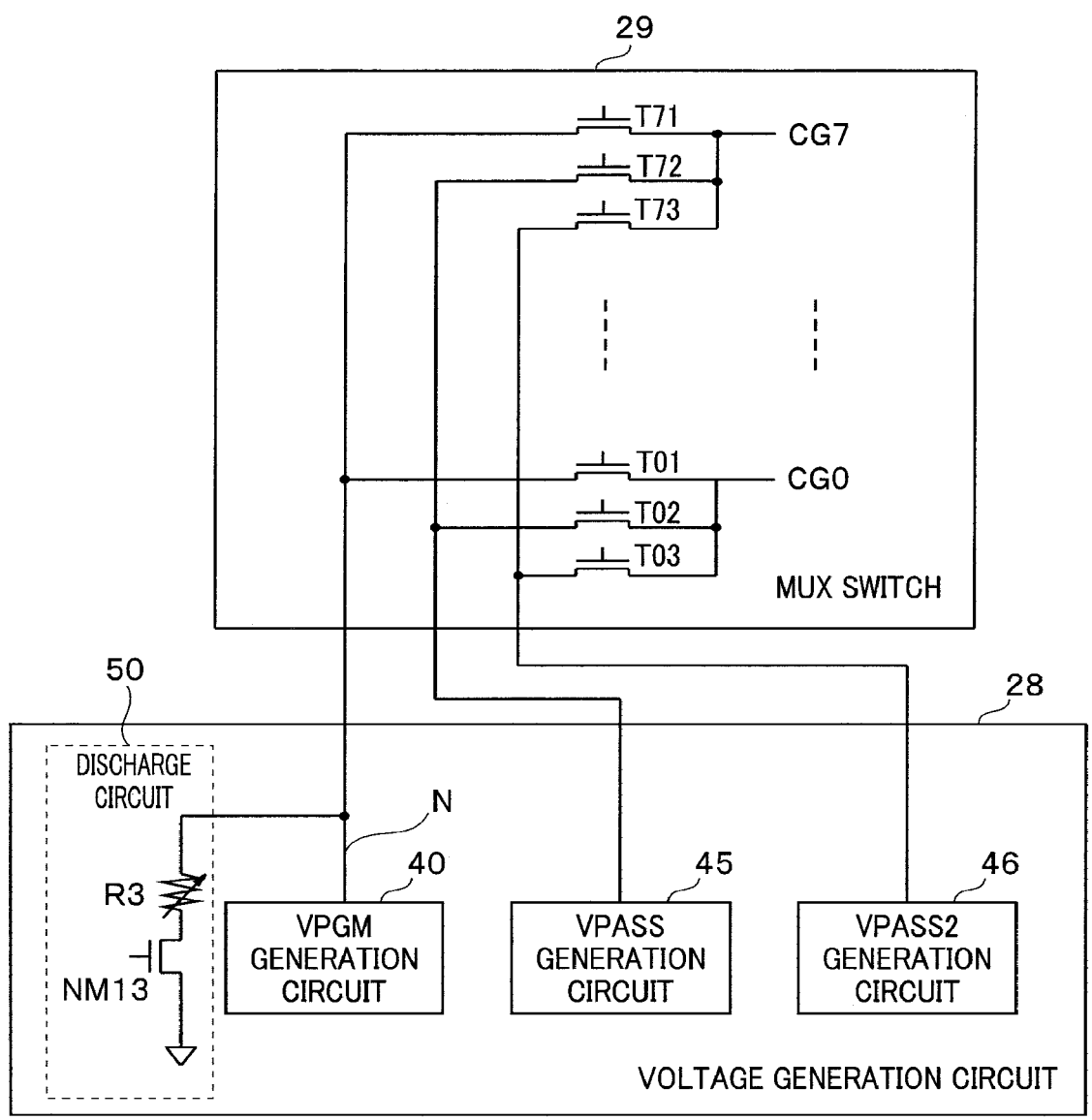
FIG. 11 is a circuit diagram showing an example of a specific configuration of the voltage generation circuit, in which a discharge circuit is provided, and a MUX switch.

FIG. 11 is a circuit diagram showing an example of a specific configuration of the voltage generation circuit 28, in which a discharge circuit 50 is provided, and the MU switch 29. FIG. 11 shows only circuit portions corresponding to the VPGM generation circuit 40, a VPASS generation circuit 45, and a VPASS2 generation circuit 46 among the respective circuits configuring the voltage generation circuit 28 and the voltage generation circuit 28 shown in FIG. 11 among the respective circuits configuring the MUX switch 29.

In the voltage generation circuit 28, besides the VPGM generation circuit 40, the VPASS generation circuit 45 and the VPASS2 generation circuit 46 are configured. The VPASS generation circuit 45 and the VPASS2 generation circuit 46 include the same configuration as the configuration of the VPGM generation circuit 40 and respectively generate the voltage VPASS and the voltage VPASS_SHIFT.

The MUX switch 29 includes a plurality of switches T01 to T03, T11 to T13, . . . , and T71 to T73 configured by transistors. The program voltage VPGM from the VPGM generation circuit 40 is supplied to the switches T01, T11, . . . , and T71. The voltage VPASS from the VPASS generation circuit 45 is supplied to the switches T02, T12, . . . , and T72. The voltage VPASS_SHIFT from the VPASS2 generation circuit 46 is supplied to the switches T03, T13, . . . , and T73. The switches T01 to T03, T11 to T13, and T71 to T73 are respectively connected to the signal lines CG0, CG1, . . . , and CG7.

The switches T01 to T03, T11 to T13, . . . and T71 to T73 are controlled by the sequencer 27 and supply the program voltages VPGM, VPASS, and VPASS_SHTFT to the signal lines CG0 to CG7.

In the present embodiment, the discharge circuit 50 is connected to a wire connecting the VPGM generation circuit 40 and the switches T01, T11, . . . , and T71, that is, a wire connected to the output node N. The discharge circuit 50 is configured by a variable resistor R3 and an NMOS transistor NM13 connected in series between the output node N and the reference voltage point. A drain of the transistor NM13 is connected to variable resistor R3, a source of the transistor NM13 is connected to the reference voltage point, and a control signal (not illustrated) from the sequencer 27 is inputted to a gate of the transistor NM13. ON and OFF of the transistor NM13 are controlled by the sequencer 27. For example, the transistor NM13 may be set to be turned on in a period in which VPASS_SHIFT is applied to the adjacent word line (hereinafter referred to as VPASS_SHIFT period).

In the present embodiment, a resistance value of the variable resistor R3 is also controlled by the sequencer 27. The sequencer 27 changes the resistance value of the variable register R3 according to, for example, the number of simultaneously operating planes. For example, the sequencer 27 sets the resistance value of the variable resister R3 smaller as the number of simultaneously operating planes is larger and sets the resistance value of the variable resistor R3 larger as the number of simultaneously operating planes is smaller. Consequently, the sequencer 27 increases a discharge current amount by the discharge circuit 50 to suppress the floating voltage of the program voltage VPGM when the number of simultaneously operating planes is large and reduces the discharge current amount by the discharge circuit 50 to suppress power consumption when the number of simultaneously operating planes is small.

Note that, in FIG. 11, an example is explained in which the discharge circuit 50 is configured by the variable resistor R3 and the transistor NM13. However, a plurality of series circuits of resistors and switches may be provided in parallel between the output node N and the reference voltage point. Resistance values of the resistors disposed in parallel are set to different resistance values corresponding to the number of simultaneously operating planes. In this case, the sequencer 27 is capable of selectively connecting the resistors having the different resistance values between the output node N and the reference voltage point by selectively turning on the switches. Alternatively, the sequencer 27 may be configured to change, according to the number of simultaneously operating planes, the number of switches to be turned on and change the number of resistors having the same or different resistance values connected between the output node N and the reference voltage point.

Note that, in FIG. 11, an example is shown in which the discharge circuit 50 is provided in the voltage generation circuit 28. However, the discharge circuit 50 may be disposed on any path from the output node N of the VPGM generation circuit 40 to an input end of the TS 30.

Figure 12:
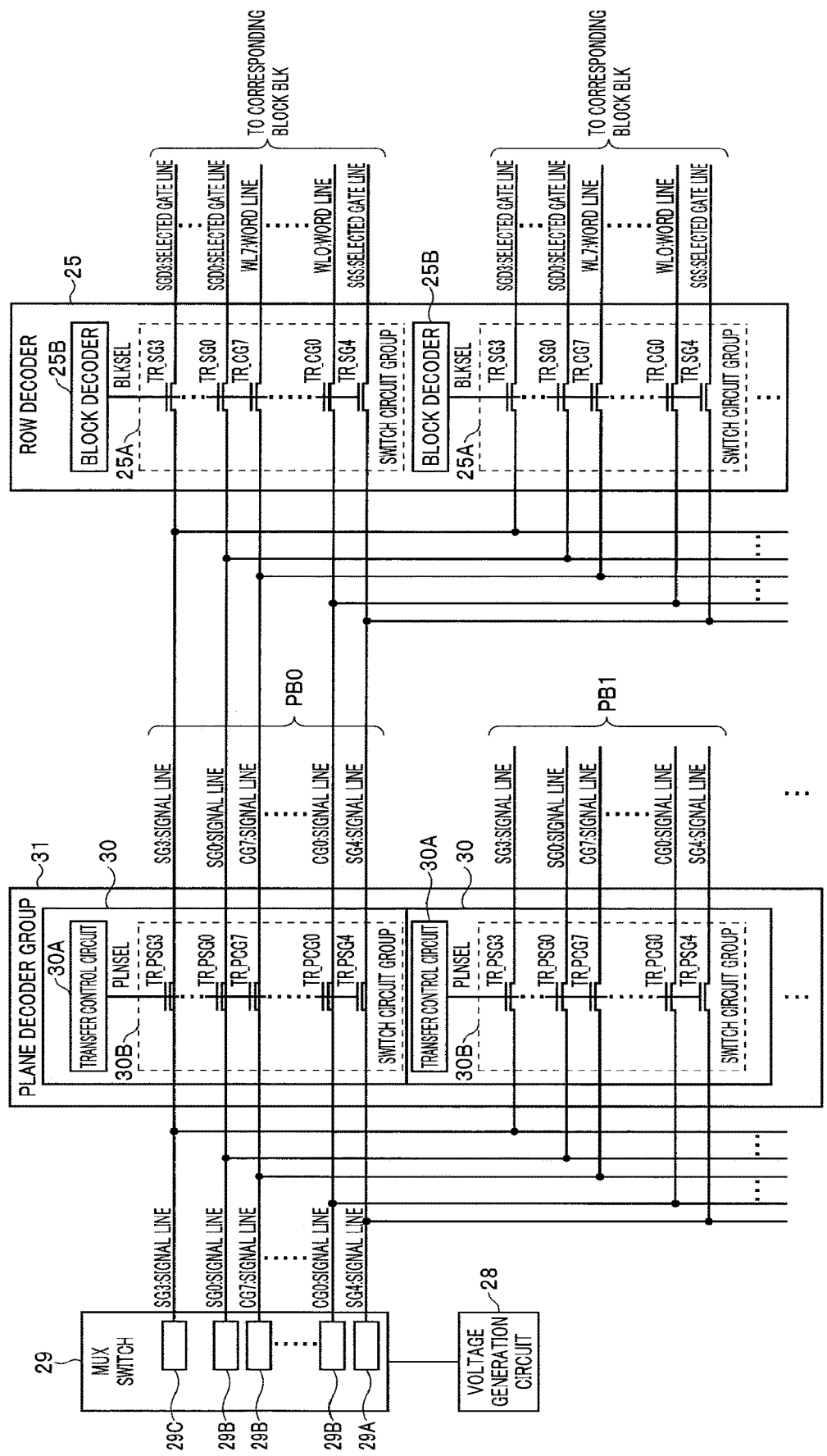
FIG. 12 is a block diagram showing an example of a specific configuration of a TS and a row decoder.

FIG. 12 is a block diagram showing an example of a specific configuration of the TS 30 and the row decoder 25. A wiring path from the voltage generation circuit 28 to the word line is explained.

As explained above, the voltage generation circuit 28 generates various voltages including a voltage necessary for the program operation, the readout operation, and the like for the memory cell transistor MT. In other words, the voltage generation circuit 28 includes a circuit (not illustrated) that supplies voltages to signal lines SG0 to SG4 and the VPGM generation circuit 40, the VPASS generation circuit 45, and the VPASS2 generation circuit 46 explained above that respectively supply voltages to the signal lines CG0 to CG7. The various voltages from the voltage generation circuit 28 are supplied to the MUX switch 29.

In FIG. 12, the MUX switch 29 includes a plurality of switch circuits 29B configured by the switches T01 to T03, T11 to T13, . . . , and T71 to T73 shown in FIG. 11. The switch circuits 29B receive, from the voltage generation circuit 28, voltages supplied to the word lines WL0 to WL7 and output the voltages to the signal lines CG0 to CG7 according to control by the sequencer 27.

The MUX switch 29 includes switch circuits 29A and 29C including the same configuration as the configuration of the switch circuit 29B. The switch circuit 29A receives, from the voltage generation circuit 28, a voltage supplied to the selection gate line SGS and outputs the voltage to the signal line SG4 according to the control by the sequencer 27. The switch circuit 29C receives, from the voltage generation circuit 28, voltages supplied to the selection gate lines SGD0 to SGD3 and outputs the voltages to the signal lines SG0 to SG3 according to the control by the sequencer 27.

The signal lines SG0 to SG4 and CG0 to CG7 are connected to the signal lines SG0 to SG4 and CG0 to CG7 of the respective planes PB by the respective plane decoders (TSs) 30 configuring the plane decoder group 31. The respective TSs 30 are configured by transfer control circuits 30A and switch circuit groups 30B. The switch circuit groups 30B include switches TR_PSG0 to TR_PSG4 and TR_PCG0 to TR_PCG7 respectively corresponding to the signal lines SG0 to SG4 and CG0 to CG7. The respective switches TR_PSG0 to TR_PSG4 and TR_PCG0 to TR_PCG7 connect the signal lines SG0 to SG4 and CG0 to CG7 connected to the MUX switch 29 respectively to the signal lines SG0 to SG4 and CG0 to CG7 of the respective planes PB.

The transfer control circuits 30A of the respective TSs 30 of the plane decoder group 31 are controlled by the sequencer 27 and generate a selection signal PLNSEL for turning on the respective switches TR_PSG0 to TR_PSG4 and TR_PCG0 to TR_PCG7 of one switch circuit group 30B among the respective switch circuit groups 30B connected to the planes PB0 to PB3. Consequently, the signal lines SG0 to SG4 and CG0 to CG7 connected to the MUX switch 29 are electrically connected to the signal lines SG0 to SG4 and CG0 to CG7 in one plane PB among the planes PB0 to PB3.

Further, the signal lines SG0 to SG4 and CG0 to CG7 in the respective planes PB are divided by the row decoder 25 and connected to wires of the respective blocks BLK. In other words, the signal lines SG0 to SG4 function as global drain side selection gate lines and are connected to, via the row decoder 25, the selection gate lines SGD0 to SGD3 functioning as local selection gate lines in the respective blocks BLK. The signal lines CG0 to CG7 function as global word lines and are connected to, via the row decoder 25, the word lines WL0 to WL7 functioning as local word lines in the respective blocks BLK. The signal line SG4 functions as a global source side selection gate line and is connected to, via the row decoder 25, the selection gate lines SGS functioning as local selection gate lines in the respective blocks BLK.

The row decoder 25 includes a plurality of switch circuit groups 25A respectively corresponding to the respective blocks and a plurality of block decoders 25B provided to respectively correspond to the plurality of switch circuit groups 25A. The respective switch circuit groups 25A include a plurality of transistors TR_SG0 to TR_SG3 respectively connecting the signal lines SG0 to SG3 and the selection gate lines SGD0 to SGD3, a plurality of transistors TR_CG0 to TR_CG7 respectively connecting the signal lines CG0 to CG7 and the word lines WL0 to WL7, and a transistor TR_SG4 connecting the signal line SG4 and the selection gate line SGS. Each of the transistors TR_SG0 to TR_SG4 and the transistors TR_CG0 to TR_CG7 is a high-withstand voltage transistor.

When the respective block decoders 25B are designated by row addresses, the respective block decoders 25B supply a block selection signal BLKSEL to gates of the transistors TR_SG0 to TR_SG4 and the transistors TR_CG0 to TR_CG7. Consequently, in the switch circuit group 25A to which the block selection signal BLKSEL is supplied from the block decoder 25B designated by the row address, the transistors TR_SG0 to TR_SG4 and the transistors TR_CG0 to TR_CG7 are turned on and conduct. Therefore, voltages supplied from the power supply generation circuit 28 to the signal lines SG0 to SG4 and the signal lines CG0 to CG7 are supplied to the selection gate lines SGD0 to SGD3 and SGS and the word lines WL0 to WL7 included in the operation target block BLK.

In other words, the program voltage VPGM is supplied to the selected word line WL by the voltage generation circuit 28, the MUX switch 29, the TS 30, and the row decoder 25, the voltage VPASS is supplied to the unselected word line WL, and the voltage VPASS and the voltage VPASS_SHIFT are supplied to the adjacent word line WL.

For example, a voltage VSG_sel is supplied to a selection gate line SGD (SGD_sel) connected to the selection gate transistor ST1 belonging to the operation target string unit SU. A voltage VSG_usel such as 0 V is supplied to a selection gate line SGD (SGD_usel) connected to the selection gate transistor ST1 not belonging to the operation target string unit SU.

(Action)

Figure 13:
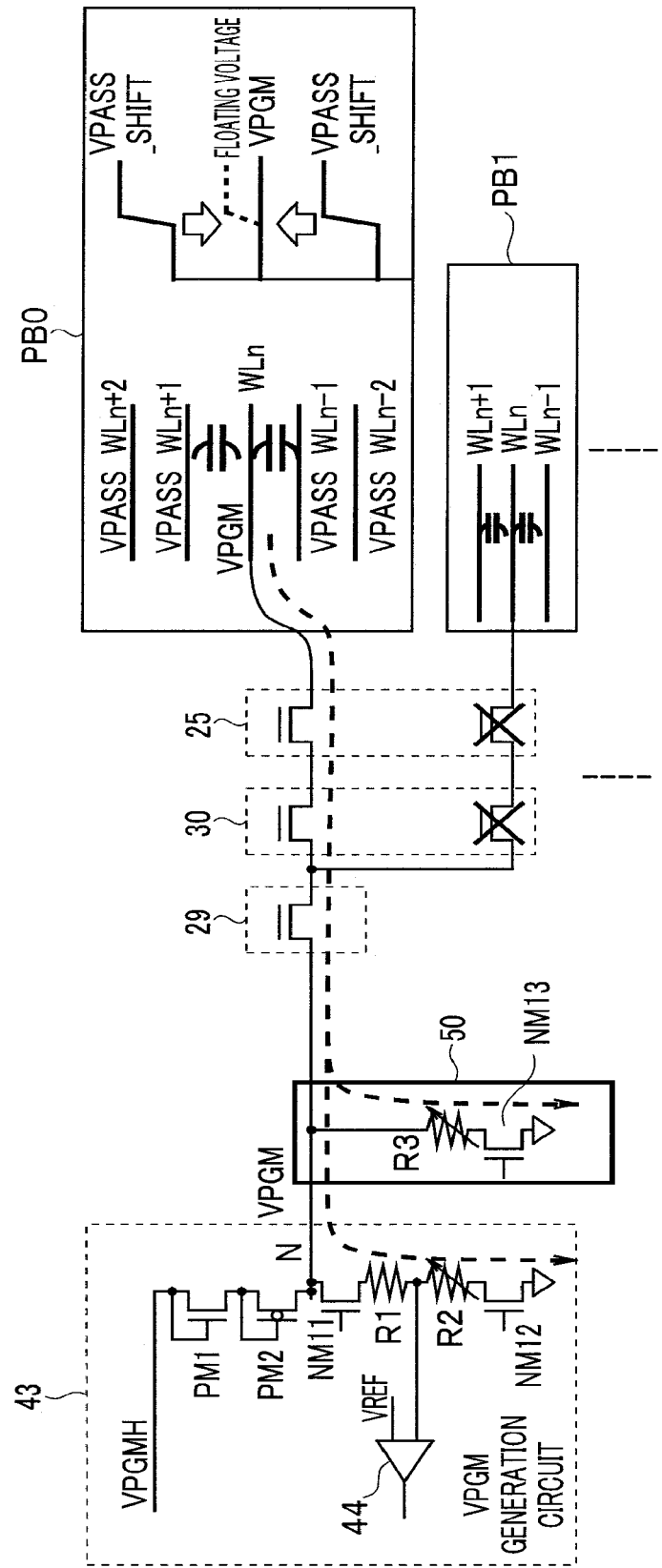
FIG. 13 is an explanatory diagram for explaining a discharging operation in a VPASS_SHIFT period.

Subsequently, an operation in the embodiment configured as explained above is explained with reference to FIG. 13. FIG. 13 is an explanatory diagram for explaining a discharging operation in a VPASS_SHIFT period.

In a program period, the sequencer 27 performs control to apply the program voltage VPGM to a selected word line (WLn) and apply the voltage VPASS to an unselected word line. In the VPASS_SHIFT period in a latter half of an application period of a predetermined program voltage VPGM, the sequencer 27 executes VPASS_SHIFT for increasing the voltage VPASS of an adjacent word line (WLn±1) to the voltage VPASS_SHIFT.

FIG. 13 indicates that a program for the plane PB0 is performed and a program for the other planes PB1 to PB3 is not performed. The program voltage VPGM is applied to the selected word line (WLn) of the plane PB, the voltage VPASS is applied to the adjacent word line (WLn±1) of the plane PB0 in a former half of the application period of the predetermined program voltage VPGM, and the voltage VPASS_SHIFT is applied in the VPASS_SHIFT period in the latter half. In the application period of the voltage VPASS_SHIFT, floating voltage easily occurs in the program voltage VPGM because of influence of the adjacent word line (WLn±1) (a broken line waveform in FIG. 13).

However, in the present embodiment, in the VPASS_SHIFT period, the sequencer 27 outputs a control signal for turning on the transistor NM13 of the discharge circuit 50. Consequently, in the VPASS_SHIFT period, the variable resistor R3 of the discharge circuit 50 is connected to the reference voltage point. Then, as indicated by a broken line arrow in FIG. 13, an electric current flows to the reference voltage point from the selected word line (WLn) through the row decoder 25, the TS 30, and the MUX switch 29 via the variable resistor R3 of the discharge circuit 50. As a result, as indicated by a waveform in FIG. 13, the floating voltage is suppressed and the program voltage VPGM maintains a substantially flat level. In other words, the floating voltage does not occur in the program voltage VPGM even in the case of a four-plane operation.

Further, in the present embodiment, the sequencer 27 changes a resistance value of the variable resistor R3 according to the number of simultaneously operating planes. Consequently, a discharge current amount of the discharge circuit 50 changes according to the number of simultaneously operating planes. It is possible to appropriately suppress the floating voltage. In this way, irrespective of the number of simultaneously operating planes, it is possible to uniformize the program voltage VPGM in the case of the multi-plane operation and the case of the single-plane operation. As a result, it is possible to reduce a writing time.

The discharge circuit 50 in the embodiment is provided in parallel to the output circuit 43 of the VPGM generation circuit 40 that outputs the voltage VPGMH. Therefore, it is unnecessary to directly increase a discharge ability of the output circuit 43 of the VPGM generation circuit 40 in order to suppress the floating voltage. Therefore, resistance values of the resistors R1 and R2 included in the output circuit 43 of the VPGM generation circuit 40 can be set sufficiently large. It is possible to suppress an increase in power consumption.

Figure 17:
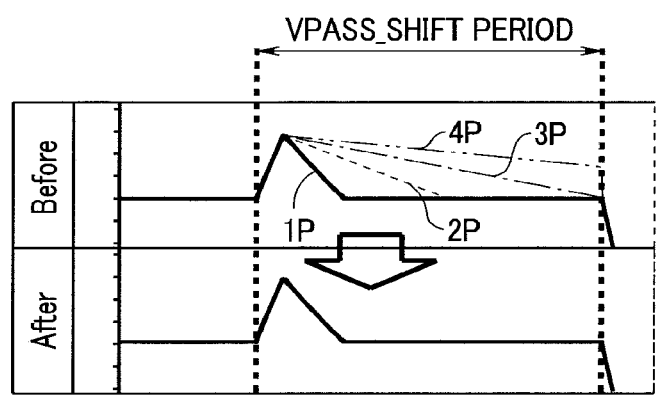
FIG. 17 is an explanatory diagram for explaining an effect in the first embodiment.

FIG. 17 is an explanatory diagram for explaining an effect in the first embodiment. FIG. 17 is tabulation of a graph showing a change of the program voltage VPGM in the signal lines CG0 to CG7 with a time plotted on a horizontal axis and a voltage plotted on a vertical axis. In FIG. 17, a field of Before indicates a program voltage VPGM waveform in a case where the discharge circuit 50 is not adopted and a field of After indicates a program voltage VPGM waveform in the present embodiment.

In FIG. 17, 1P, 2P, 3P, and 4P respectively indicate examples in which the number of simultaneously operating planes is one, two, three, and four. As it is evident from comparison of the field of Before and the field of After, it is seen that, according to the first embodiment in which the discharge circuit 50 is adopted, in any position on a wire, floating voltage is uniformly suppressed and the program voltage VPGM in the VPASS_SHIFT period uniformly changes irrespective of a difference in the number of simultaneously operating planes.

As explained above, in the present embodiment, in the VPASS_SHIFT period during the application period of the program voltage VPGM, by feeding the discharge current via the discharge circuit provided in the wire for supplying the program voltage VPGM, even in the multi-plane operation, it is possible to suppress the floating voltage that occurs in the program voltage VPGM. In this case, a discharge current amount of the discharge circuit is changed according to the number of simultaneously operating planes to achieve uniformization of the program voltage VPGM irrespective of the number of simultaneously operating planes. Consequently, as a result, it is possible to reduce a writing time.

(Modification)

In the above explanation, an example is explained in which the sequencer 27 changes the resistance value of the variable register R3 in the discharge circuit 50 according to the number of simultaneously operating planes. Further, the sequencer 27 may change the resistance value of the variable register R3 in the discharge circuit 50 according to a level of the program voltage VPGM.

As the level of the program voltage VPGM is higher, a level of the floating voltage is smaller because an electric current flowing to the limit circuit in the VPGM generation circuit 40 is larger. Therefore, the sequencer 27 performs control to set the resistance value of the variable resistor R3 higher and set the discharge current amount smaller as the level of the program voltage VPGM is higher and set the resistance value of the variable register R3 smaller and set the discharge current amount larger as the level of the program voltage VPGM is lower.

Note that, in this case, as in the first embodiment, a plurality of resistors may be disposed between the output node N and the reference voltage point and a resistor connected between the output node N and the reference voltage point may be selected by a switch.

Second Embodiment

Figure 14:
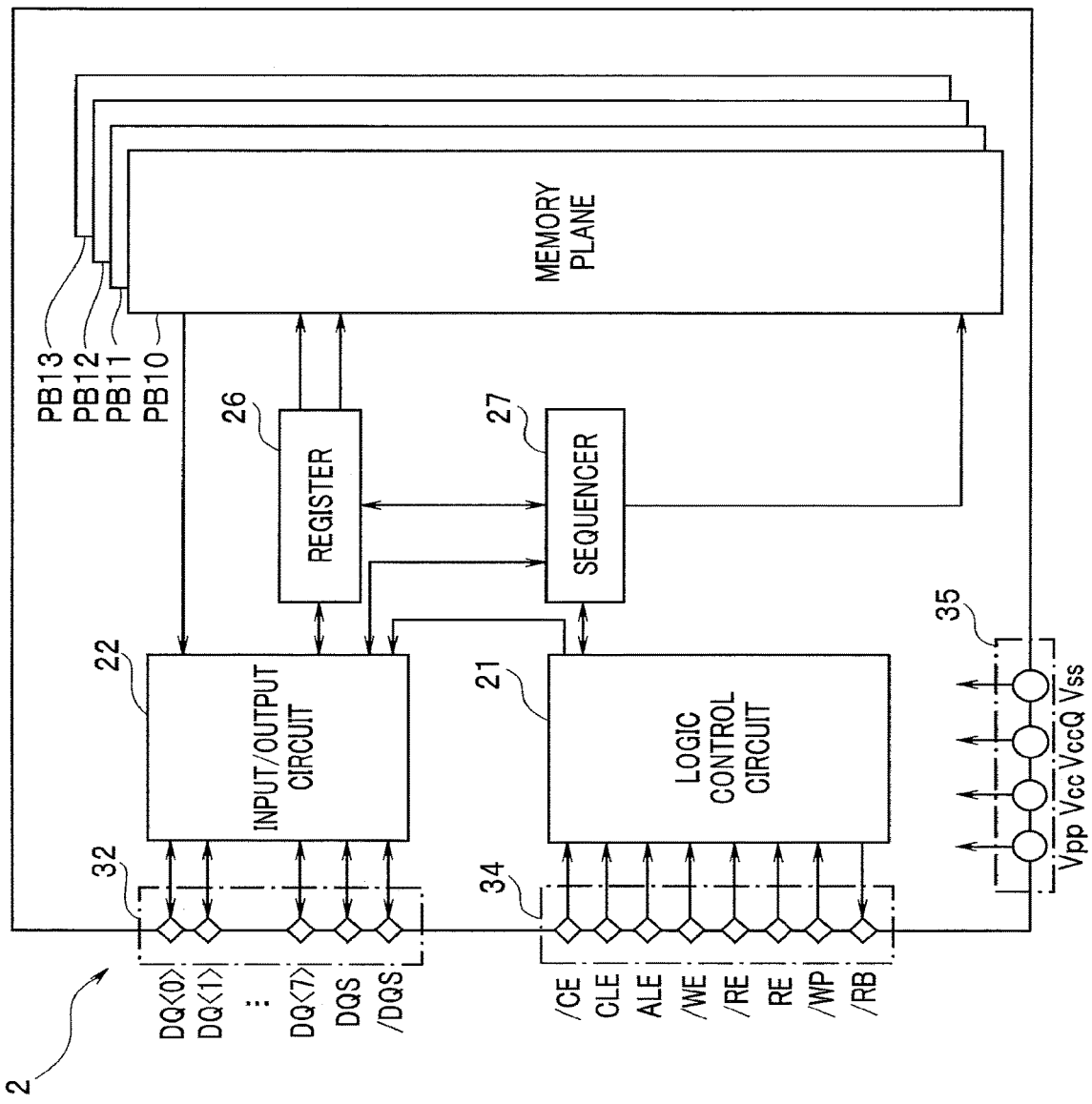
FIG. 14 is a block diagram showing a configuration example of a nonvolatile memory in a second embodiment.
Figure 15:
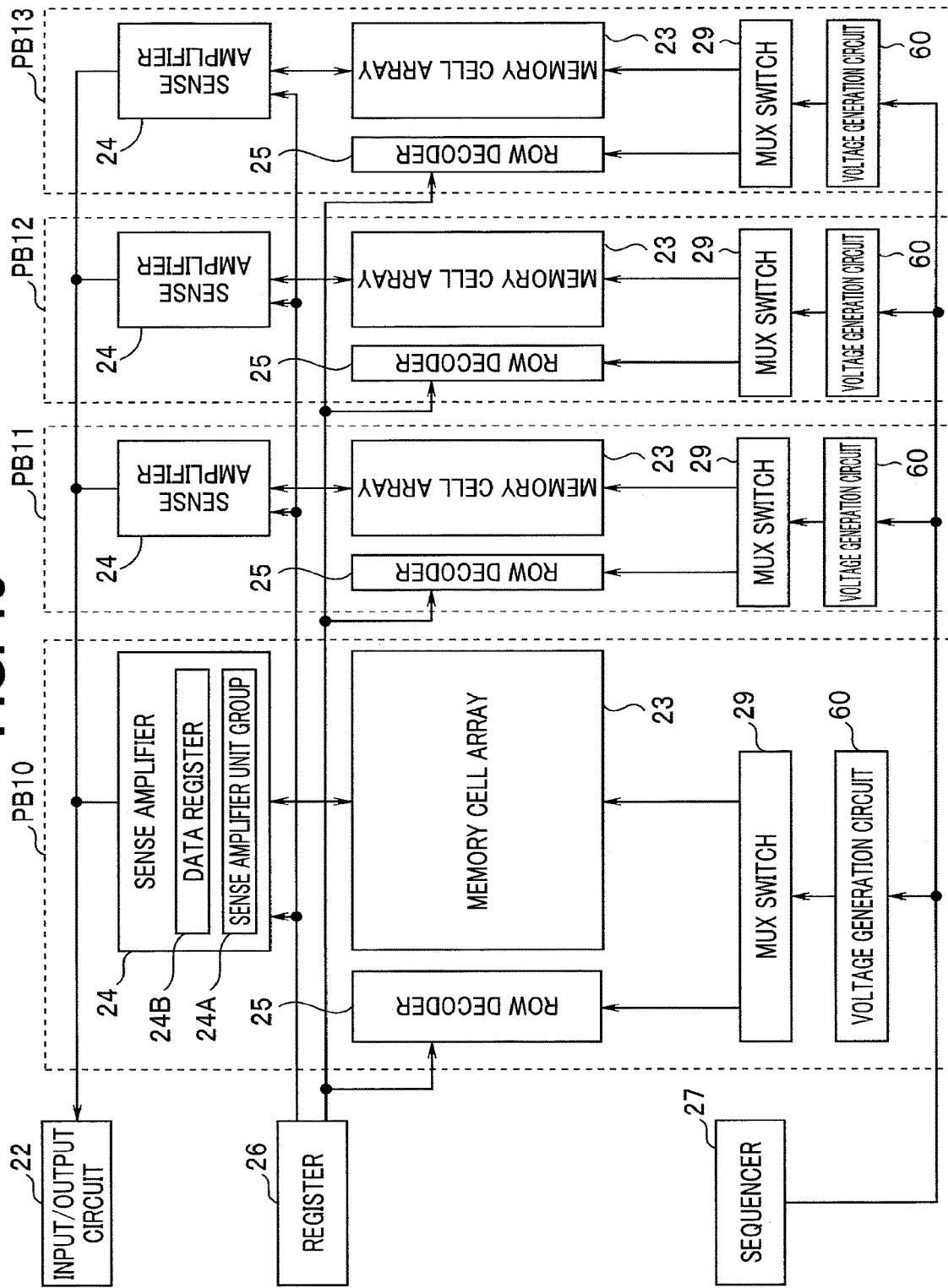
FIG. 15 is a block diagram showing an example of a specific configuration of a plurality of planes shown in FIG. 14.

FIGS. 14 and 15 relate to a second embodiment of the present invention. FIG. 14 is a block diagram showing a configuration example of a nonvolatile memory in the second embodiment. FIG. 15 is a block diagram showing an example of a specific configuration of a plurality of planes shown in FIG. 14. In FIGS. 14 and 15, the same components as the components shown in FIGS. 2 and 3 are denoted by the same reference numerals and signs and explanation of the components is omitted.

In the present embodiment, as in the case of the single-plane configuration, suppression of floating voltage is enabled by providing, for each of planes PB10 to PB13 (hereinafter referred to as planes PB1 when it is unnecessary to distinguish the planes PB10 to PB13), a discharge path by a limit circuit configured in the VPGM generation circuit 40. In other words, in the present embodiment, as shown in FIGS. 14 and 15, voltage generation circuits 60 and the MUX switches 29 are configured in the respective planes PB1 and the TSs 30 are omitted from the respective planes PB1.

The voltage generation circuit 60 is obtained by omitting the discharge circuit 50 from the voltage generation circuit 28 shown in FIG. 11. The other components of the voltage generation circuit 60 are the same as the components of the voltage generation circuit 28. In other words, the VPGM generation circuit 40 shown in FIG. 8 is configured in the voltage generation circuit 60. The discharge path by the limit circuit is configured in the VPGM generation circuit 40.

Note that, since the voltage generation circuits 60 and the MUX switches 29 are provided in the respective planes PB1, the TSs 30 for selecting the planes PB1 and supplying a voltage are omitted.

In the embodiment configured as explained above, the selected word line WLn of the single plane PB1 is connected to the output node N of the VPGM generation circuit 40. As a result, the same discharge as the discharge in the single plane configuration is performed by the limit circuit in the VPGM generation circuit 40 and floating voltage is suppressed. In the respective planes PB1, the same discharge is performed by the limit circuits in the VPGM generation circuits 40. It is possible to achieve uniformization of the program voltage VPGM among the respective planes PB1.

As explained above, in the present embodiment as well, it is possible to achieve uniformization of the program voltage VPGM irrespective of the number of simultaneously operating planes. As a result, it is possible to reduce a writing time.

Note that, in the present embodiment, an electric current flowing to the limit circuit in the VPGM generation circuit 40 may be changed according to a level of the program voltage VPGM. In other words, the sequencer 27 performs control to set a resistance value of the variable resistor R2 configuring the limit circuit higher and set a discharge current amount smaller as the level of the program voltage VPGM is higher and set the resistance value of the variable register R2 smaller and set the discharge current amount larger as the level of the program voltage VPGM is lower.

Consequently, in the present embodiment as well, it is possible to uniformly suppress floating voltage irrespective of the level of the program voltage VPGM.

Third Embodiment

Figure 16:
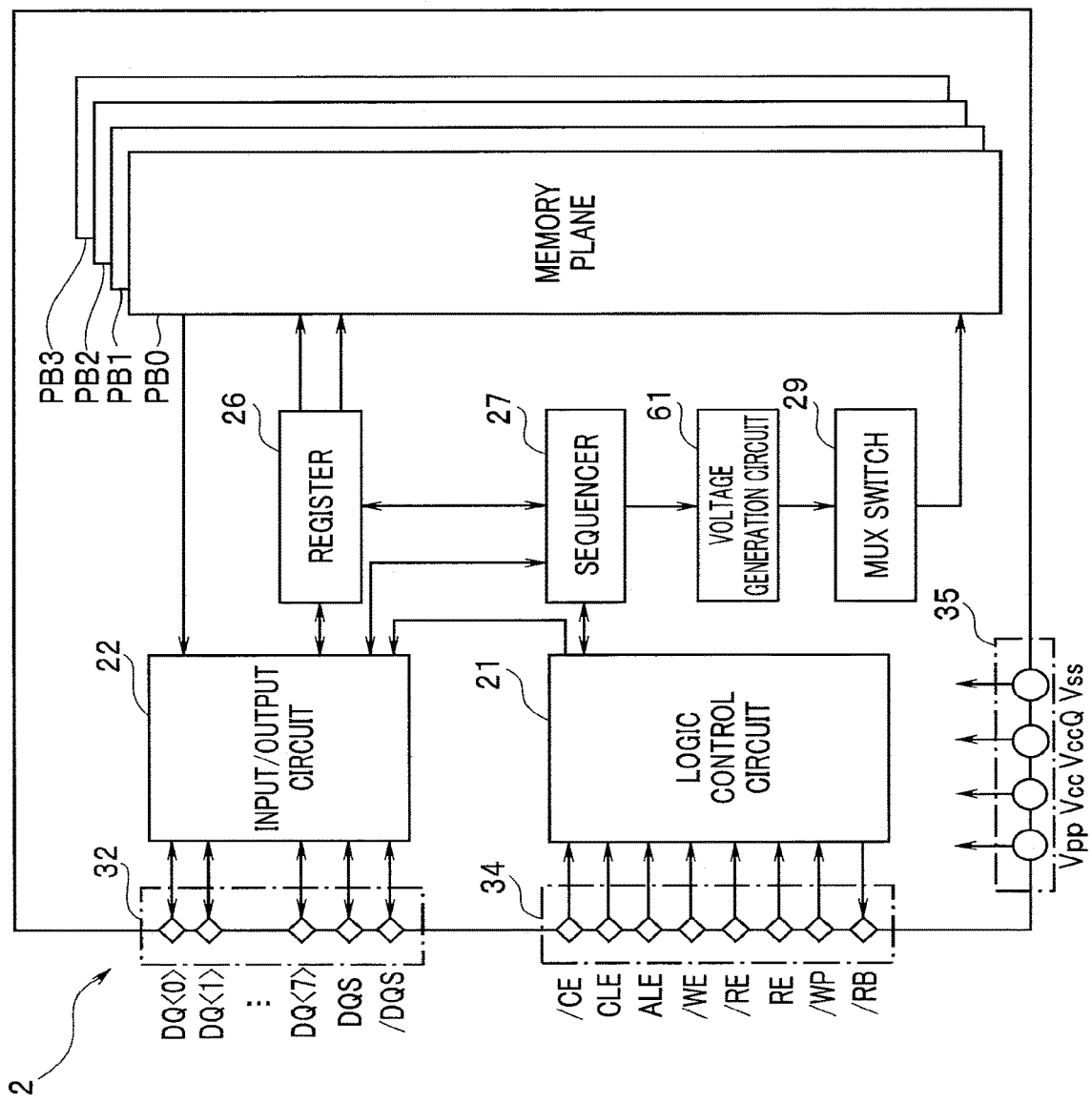
FIG. 16 is a block diagram showing a third embodiment of the present invention.

FIG. 16 is a block diagram showing a third embodiment of the present invention. In FIG. 16, the same components as the components shown in FIG. 2 are denoted by the same reference numerals and signs and explanation of the components is omitted. A hardware configuration in the present embodiment is different from the hardware configuration shown in FIG. 2 in that a voltage generation circuit 61 is adopted instead of the voltage generation circuit 28. The present embodiment achieves uniformization of the program voltage VPGM by changing a level of the voltage VPASS_SHIFT according to the number of simultaneously operating planes.

The voltage generation circuit 61 is obtained by omitting the discharge circuit 50 from the voltage generation circuit 28 shown in FIG. 11. The other components are the same as the components of the voltage generation circuit 28. The voltage generation circuit 61 includes the charge pump circuit 41 and the clock control circuit 42 illustrated in FIG. 8 and the VPASS generation circuit 45 and the VPASS2 generation circuit 46 illustrated in FIG. 11. The voltage generation circuit 61 is configured to be able to change the level of the voltage VPASS_SHIFT from the VPASS2 generation circuit 46 by switching, based on a control signal from the sequencer 27, the number of clocks of the clock signals CLK and /CLK from the clock control circuit 42, the number of stages of the charge pump circuit 41, and the like.

In the present embodiment, the sequencer 27 is configured to control the voltage generation circuit 61 to change the level of the voltage VPASS_SHIFT according to the number of simultaneously operating planes. For example, the sequencer 27 sets the level of the voltage VPASS_SHIFT smaller as the number of simultaneously operating planes is larger and sets the level of the voltage VPASS_SHIFT larger as the number of simultaneously operating planes is smaller. Consequently, the sequencer 27 suppresses a boost amount of the program voltage VPGM to suppress occurrence of floating voltage when the number of simultaneously operating planes is large and increases the boost amount of the program voltage VPGM to suppress a decrease of the program voltage VPGM when the number of simultaneously operating planes is small.

In the present embodiment, the sequencer 27 may change the level of the voltage VPASS_SHIFT according to the level of the program voltage VPGM. For example, the sequencer 27 may set the level of the voltage VPASS_SHIFT larger to suppress the decrease of the program voltage VPGM as the level of the program voltage VPGM is higher and set the level of the voltage VPASS_SHIFT smaller to suppress occurrence of floating voltage of the program voltage VPGM as the level of the program voltage VPGM is lower.

As explained above, in the present embodiment, as in the first embodiment, it is possible to suppress, irrespective of the number of simultaneously operating planes, floating voltage that occurs in the program voltage VPGM and uniformize the program voltage VPGM. Consequently, as a result, it is possible to reduce a writing time.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
   a plurality of planes each including a memory cell array configured by a plurality of memory cells, word lines connected to gates of the plurality of memory cells, and bit lines electrically connected to one ends of the plurality of memory cells via selection gate transistors respectively connected to the one ends of the plurality of memory cells;
   a voltage generation circuit capable of generating a voltage supplied to one or more of the memory cell arrays respectively included in the plurality of planes, the voltage generation circuit supplying a program voltage to a writing target selected word line in a program period and applying a first intermediate voltage to an adjacent word line adjacent to the selected word line in a former half of the program period and applying a second intermediate voltage higher than the first intermediate voltage to the adjacent word line in a latter half of the program period;
   a discharge circuit provided on a path between the voltage generation circuit and the selected word line and configured to feed a discharge current from the selected word line in a period corresponding to a period in which the second intermediate voltage is applied to the adjacent word line; and
   a control circuit configured to set a discharge characteristic of the discharge circuit according to a number of the planes to which the program voltage is simultaneously supplied from the voltage generation circuit.

2. The semiconductor storage device according to claim 1, wherein the control circuit sets the discharge characteristic of the discharge circuit according to a level of the program voltage.

3. The semiconductor storage device according to claim 1, wherein
   the voltage generation circuit includes a limit circuit configured to limit the program voltage supplied to the selected word line to a specified value, and
   the limit circuit includes a discharge path fir feeding the discharge current from the selected word line.

4. The semiconductor storage device according to claim 1, wherein a switch for selecting a word line to which various voltages are supplied, a plane decoder for distributing the switch to respective planes, and a row decoder for distributing an output of the plane decoder to respective blocks in the memory cell array are provided between the voltage generation circuit and the word lines.

5. The semiconductor storage device according to claim 4, wherein the discharge circuit is provided between the voltage generation circuit and the switch.

6. A semiconductor storage device comprising:
   a plurality of planes each including a memory cell array configured by a plurality of memory cells, word lines connected to gates of the plurality of memory cells, and bit lines electrically connected to one ends of the plurality of memory cells via selection gate transistors respectively connected to the one ends of the plurality of memory cells;
   a voltage generation circuit provided in each of the plurality of planes, capable of generating a voltage supplied to the memory cell array, and including a limit circuit configured to limit a program voltage supplied to a writing target selected word line to a specified value, the voltage generation circuit supplying a program voltage to the selected word line in a program period and applying a first intermediate voltage to an adjacent word line adjacent to the selected word line in a former half of the program period and applying a second intermediate voltage higher than the first intermediate voltage to the adjacent word line in a latter half of the program period; and
   a control circuit configured to set, according to a level of the program voltage, a current amount flowing to the limit circuit.

7. A semiconductor storage device comprising:
   a plurality of planes each including a memory cell array configured by a plurality of memory cells, word lines connected to gates of the plurality of memory cells, and bit lines electrically connected to one ends of the plurality of memory cells via selection gate transistors respectively connected to the one ends of the plurality of memory cells;

a voltage generation circuit capable of generating a voltage supplied to one or more of the memory cell arrays respectively included in the plurality of planes, the voltage generation circuit supplying a program voltage to a writing target selected word line in a program period and applying a first intermediate voltage to an adjacent word line adjacent to the selected word line in a former half of the program period and applying a second intermediate voltage higher than the first intermediate voltage to the adjacent word line in a latter half of the program period; and a control circuit configured to set a level of the second intermediate voltage according to a number of the planes to which the program voltage is simultaneously supplied from the voltage generation circuit.

8. The semiconductor storage device according to claim 7, wherein the control circuit sets the level of the second intermediate voltage according to a level of the program voltage.

\* \* \* \* \*